(12) United States Patent
Borna Tutuc et al.

(10) Patent No.: US 10,580,656 B2
(45) Date of Patent: Mar. 3, 2020

(54) METHOD OF REDUCING TRENCH DEPTH VARIATION FROM REACTIVE ION ETCHING PROCESS

(71) Applicant: Infineon Technologies AG, Neubiberg (DE)

(72) Inventors: Marija Borna Tutuc, Villach (AT); Daniel Tutuc, Villach (AT); Andrew Christopher Graeme Wood, St. Jakob im Rosental (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/029,261

(22) Filed: Jul. 6, 2018

(65) Prior Publication Data

US 2020/0013631 A1      Jan. 9, 2020

(51) Int. Cl.
| | |
|---|---|
| *H01L 21/3065* | (2006.01) |
| *H01L 21/765* | (2006.01) |
| *H01L 21/308* | (2006.01) |
| *H01L 21/306* | (2006.01) |

(52) U.S. Cl.
CPC .... *H01L 21/30655* (2013.01); *H01L 21/3081* (2013.01); *H01L 21/3086* (2013.01); *H01L 21/30625* (2013.01); *H01L 21/765* (2013.01)

(58) Field of Classification Search
CPC ......... H01L 21/30655; H01L 21/30625; H01L 21/3086; H01L 21/765; H01L 21/3081
See application file for complete search history.

(56) References Cited

U.S. PATENT DOCUMENTS

| | | | |
|---|---|---|---|
| 9,443,973 B2 | 9/2016 | Jin et al. | |
| 2012/0175745 A1* | 7/2012 | Su | H01L 21/0337 257/622 |

* cited by examiner

*Primary Examiner* — Karen Kusumakar
(74) *Attorney, Agent, or Firm* — Murphy, Bilak & Homiller, PLLC

(57) ABSTRACT

A semiconductor wafer having a main surface is provided. A first etch resistant mask is provided on the main surface. A first reactive ion etching step that forms a first group of trenches using the first etch resistant mask is performed. Each of the trenches in the first group is covered with a second etch resistant mask after performing the first reactive ion etching step. A second reactive ion etching step that forms a second group of trenches using one or both of the first etch resistant mask and the second etch resistant mask is performed. The trenches in the second group are laterally offset from the trenches in the first group. The first and second reactive ion etching processes are performed such that a depth of the trenches of the first group is substantially equal to a depth of the trenches in the second group.

28 Claims, 29 Drawing Sheets

METHOD OF REDUCING TRENCH DEPTH VARIATION FROM REACTIVE ION ETCHING PROCESS

TECHNICAL FIELD

The instant application relates to semiconductor device manufacturing and particularly relates to etching techniques for forming trenches in a semiconductor wafer.

BACKGROUND

Deep and high aspect ratio trenches are desirable in many semiconductor applications. An example of such an application is power switching applications, i.e., applications which require switching of large voltages, e.g., 25-600 V or greater. Semiconductor devices used in these applications, such as power transistors, commonly include field plate structures. Field plates are used to provide compensatory charges in the drift region of the device, thereby enabling a favorable improvement in the tradeoff between breakdown voltage rating and on-resistance. In a vertical power semiconductor device, the field plate must vertically span adjacent to the drift region of the device. This means that the field plate can span across most of the thickness of the drift region, which may represent a substantial majority of the overall thickness of the device. Accordingly, the technology used to form field plates must be capable of forming deep and high aspect ratio trenches so that the field plate can extend deeply into the drift region.

One technique for forming deep and high aspect ratio trenches is reactive ion etching. Although reactive ion etching has many advantages, several drawbacks exist. One drawback is a relatively large process window with respect to trench depth. That is, across a single wafer, the depth of trenches formed by a common reactive ion etching step can vary significantly. Another potential drawback of reactive ion etching is the formation of so-called black-silicon, i.e., needle shaped structures in the semiconductor material.

SUMMARY

A method of forming a semiconductor device is disclosed. According to an embodiment of the method, a semiconductor wafer having a main surface is provided. A first etch resistant mask is provided on the semiconductor wafer that partially covers the main surface and includes a first set of openings that expose the main surface. A first reactive ion etching step that forms a first group of trenches by removing semiconductor material through the first set of openings is performed. Each of the trenches in the first group is covered with a second etch resistant mask after performing the first reactive ion etching step. A second set of openings is provided in one or both of: the first etch resistant mask, and the second etch resistant mask. The second set of openings expose the main surface. A second reactive ion etching step that forms a second group of trenches by removing semiconductor material through the second set of openings is performed. The trenches in the second group are laterally offset from the trenches in the first group. The first and second first reactive ion etching processes are performed such that a depth of the trenches of the first group is substantially equal to a depth of the trenches in the second group.

According to another embodiment of the method, a semiconductor wafer having a main surface is provided. A first reactive ion etching process that forms a first group of trenches extending from the main surface into the semiconductor wafer is performed. A second reactive ion etching process is performed after performing the first reactive ion etching process. The second reactive ion etching process forms a second group of trenches. Each of the trenches in the second group extend from the main surface into the semiconductor wafer and are laterally offset from the trenches in the first group. The main surface of the semiconductor wafer is covered with etch resistant material during both of the first and second reactive ion etching processes such that no more than half of an overall surface area of the main surface is exposed to etchant particles during each of the first and second reactive ion etching processes. The first and second first reactive ion etching processes are performed such that a depth of the trenches of the first group is substantially equal to a depth of the trenches in the second group.

According to another embodiment of the method, a semiconductor wafer having a main surface and an interface beneath the main surface is provided. A maximum target trench depth for trenches formed in the semiconductor wafer is determined. The maximum target trench depth is less than a distance between the main surface and the interface. A first reactive ion etching process that forms a first group of trenches extending from the main surface into the semiconductor wafer is performed. A second reactive ion etching process that forms a second group of trenches extending from the main surface into the semiconductor wafer is performed. The trenches in the second group are laterally offset from the trenches in the first group. A percentage surface area of the main surface of the semiconductor wafer is covered with etch resistant material during both of the first and second reactive ion etching processes. Process parameters of the first and second reactive ion etching processes are controlled such that a depth of the trenches in the first and second groups is substantially equal to the maximum target trench depth. Determining the maximum target trench depth includes correlating a variation in the depth of the trenches in the first and second groups to the percentage surface area of the main surface that is covered with etch resistant material during each of the first and second reactive ion etching processes.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments described herein provide a technique for forming deep and high aspect ratio trenches by reactive ion etching, while overcoming the drawbacks of previous techniques. According to these embodiments, multiple reactive ion etching steps (e.g., two, three, four, etc.) are used to form multiple groups (e.g., two, three, four, etc.) of trenches. The trenches from each group can be formed to be substantially identical to one another, e.g., with the same width and depth. During each reactive ion etching step, only the surface area that is required to form one specific group of trenches is exposed to etchant particles, while the rest of the wafer remains covered. In this way, the amount of wafer surface area that is exposed during any one reactive ion etching process is reduced in comparison to a single reactive ion etching step that forms all trenches together at one time.

There are notable benefits to forming trenches using multiple reactive ion etching steps according to the techniques described herein. One benefit is a reduction in trench depth variation. Another benefit is a mitigation or even complete elimination of black silicon. The inventors have thoroughly studied the causes of trench depth variation and black silicon in reactive ion etching processes and thoroughly studied the practical limits of modern reactive ion etching equipment with respect to these phenomena. To summarize the findings of the inventors, trench depth variation and the formation of black silicon is directly affected by the amount of exposed wafer surface area during the reactive ion etching process. The techniques described herein advantageously enable any number and size trenches to be formed in a semiconductor wafer while keeping the exposed surface area sufficiently low to realize a beneficial reduction in trench depth variation.

Figure 1:
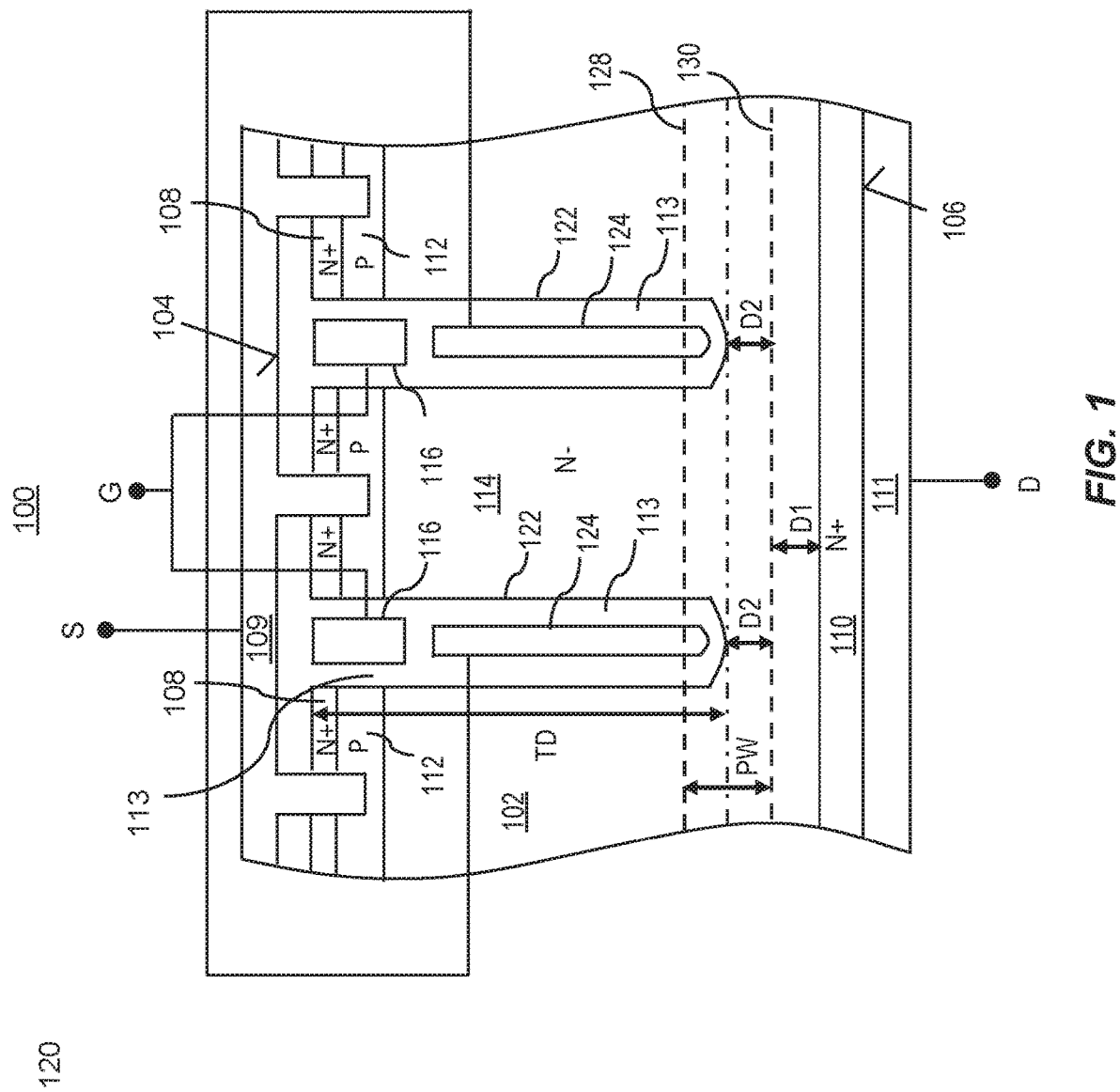
FIG. 1 illustrates a vertical power semiconductor device having field plate trenches, according to an embodiment.

Referring to FIG. 1, a cross-sectional view of a vertical power semiconductor device 100 is depicted, according to an embodiment. The vertical power semiconductor device 100 is formed in a semiconductor body 102 with a main surface 104 and a rear surface 106 that is opposite the main surface 104. In this embodiment, the vertical power semiconductor device 100 is configured as a trenched gate vertical MOSFET. According to this configuration, a first conductivity type (e.g., n-doped) source region 108 is formed at the main surface 104 and a first conductivity type drain region 110 is formed at the rear surface 106. An electrically conductive source electrode 109 is disposed on the main surface 106 and forms a low ohmic connection with the source region 108. An electrically conductive drain electrode 111 is disposed on the rear surface 106 and forms a low ohmic connection with the drain region 110. A second conductivity type (e.g., p-doped) body region 112 and a first conductivity type drift region 114 are provided between the source and drain regions 108, 110 in a vertical direction of the semiconductor body 102. A gate electrode 116 is provided in the semiconductor body 102 with a dielectric layer 113 insulating the gate electrode 116 from the body region 112. Current flows vertically in the device between source and drain regions 108, 110. In a commonly known manner, the gate electrode 116 is configured control a conductive channel in the body region 112.

The power semiconductor device 100 additionally includes field plates 124 disposed in the semiconductor body 102 adjacent to the drift region 114. The dielectric layer 113 insulates the field plates 124 from the drift region 114. The field plates 124 are configured to provide charges (e.g., electrons) that compensate for complementary type charges (e.g., holes) in the drift region 114 when the device is in a reverse-blocking state, i.e., when the gate is turned OFF and the drain potential exceeds the source potential. These compensating charges are provided by connecting the field plate 124 to the source potential. The charge compensation from the field plate 124 lowers the electric field gradient in the drift region 114 in the reverse-blocking state, thereby enabling an improvement to the voltage rating of the device.

The power semiconductor device 100 includes vertical trenches 122 that contain the gate electrode 116, the field plate 124 and the dielectric layer 113. The vertical trenches 122 extend vertically from the main surface 104 into the semiconductor body 102 towards the rear surface 106. The field plate 124 and the gate electrode 116 can be formed from an electrical conductor, e.g., polysilicon, tungsten, aluminum, etc. The dielectric layer 113 can be formed from an insulative material, e.g., silicon dioxide ($SiO_2$).

The vertical trenches 122 are formed to a maximum target depth (TD). The maximum target depth (TD) represents a desired depth of the vertical trenches 122 as measured between the main surface 104 and the bottom of the vertical trench 122. In this embodiment, the maximum target depth (TD) is correlated to a distance between the main surface 104 and an interface between the drift and drain regions 114, 110. The maximum target depth (TD) is chosen by the device designer based on several considerations. One important consideration is the performance of the field plate structures. In the vertical power semiconductor device 100, maximal performance benefit of the field plate 124 is obtained if the field plate 124 can span across as much of the drift region 114 as possible. This consideration would suggest forming the vertical trench 122 to extend the complete length of the drift region 114, i.e., to reach the drain region 110. However, countervailing considerations make this trench depth impractical. First, if the bottom of the field plate 124 is located too close to the drain region 110, a large electric field gradient can develop under high current conditions between the field plate 124 and the drain region 110, which can result in a reduced avalanche current capability. For this reason, a first minimum distance D1 must be provided between the drain region 110 and the bottoms of the vertical trenches 122 to disperse this electric field gradient and thus provide a high-current avalanche breakdown capability. Another consideration is the process window of the technique used to form the vertical trenches 122. Trench etching techniques, such as reactive ion etching, produce trenches with varying depth across the entire wafer. By way of example, in modern process technologies, the depth of the various field plate trenches formed in one semiconductor wafer can vary by 8 percent, if not more. FIG. 1 schematically illustrates the effect of this variation with a trench depth process window (PW). The spectrum of the trench depth process window includes a shallowest vertical trench depth 128 and a deepest vertical trench depth 130 for trenches formed by the same process. For this reason, a second minimum distance D2 must be added to the first minimum distance D1 to arrive at the maximum target depth (TD). The target depth (TD) is selected so that the deepest vertical trench 122 formed in the semiconductor body 102 (i.e., the trench that reaches the deepest field plate trench depth 130) is separated from the drain region 110 by at least the first minimum distance D1. This ensures that every device formed meets the necessary avalanche breakdown requirements.

Figure 2:
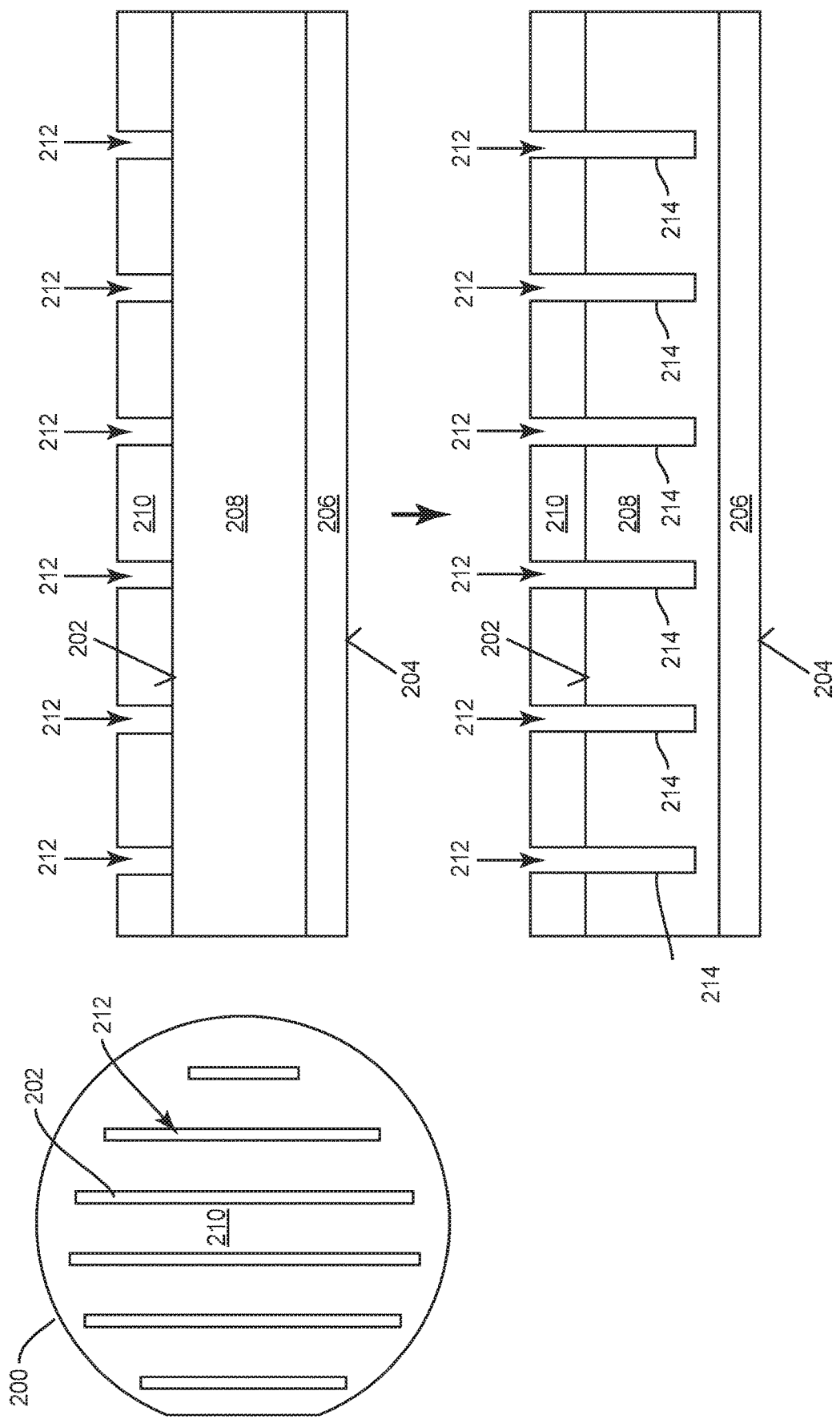
FIG. 2 illustrates a first reactive ion etching step in a method of forming a semiconductor device, according to an embodiment.

Referring to FIG. 2, a multi-step reactive ion etching method is shown. According to the method, a semiconductor wafer 200 is provided. The semiconductor wafer 200 is shown from a plan view perspective on the left side of the figure and from a cross-sectional perspective on the right sight of the figure. The semiconductor wafer 200 includes a main (upper) surface 202 and a rear surface 204 opposite the main surface 202. The semiconductor wafer 200 includes a base substrate 206 that provides the rear surface 204 and an epitaxial layer 208 that is formed on the base substrate 206 and extends to the main surface 202. In one example, the base substrate 206 is a commercially available bulk semiconductor wafer 200, such as a silicon wafer. The epitaxial layer 208 can be lightly doped semiconductor material (e.g., n– silicon) that is formed on the bulk wafer using commonly known epitaxial techniques. More generally, the base substrate 206 and/or the epitaxial layer 208 can include a wide variety of semiconductor materials including compound group IV semiconductor materials such as silicon carbide (SiC) or silicon germanium (SiGe) and group III-V semiconductor materials such as gallium nitride (GaN), gallium arsenide (GaAs), etc.

Once the semiconductor wafer 200 is provided, a first etch resistant mask 210 is provided on the main surface 202 of the semiconductor wafer 200. Generally speaking, the material of the first etch resistant mask 210 can be any material that is effective as a mask in a reactive ion etching process. That is, the material of the first etch resistant mask 210 effectively blocks energized plasma ions from reaching the main surface 202 of the semiconductor wafer 200. This can include so-called hardmask materials such as carbon, carbon-containing material (e.g., diamond-like-carbon (DLC)), semiconductor oxides and nitrides, such as silicon nitride (SiN), silicon dioxide ($SiO_2$) or silicon oxynitride ($SiO_xN_Y$) and metal nitrides, such as titanium nitride (TiN), to name a few. Alternatively, the first etch resistant mask 210 can include any of a variety of photoresist materials, such as photopolymeric photoresist, photodecomposing photoresist and photocrosslinking photoresist, etc.

A first set of openings 212 is provided in the first etch resistant mask 210. The first set of openings 212 expose the main surface 202 of the semiconductor wafer 200. As can be seen, the first set of openings 212 are patterned to provide a desired trench geometry. This can be done indirectly (i.e., by initially forming the first etch resistant mask 210 as a continuous layer and patterning the first etch resistant mask 210 using a separate mask on top of the first etch resistant mask 210) or directly (i.e., by forming the first etch resistant mask 210 as a patterned structure in one step (e.g., using photolithography). Specific examples of both techniques will be discussed in further detail below.

After providing the first etch resistant mask 210, a first reactive ion etching step is performed. Generally speaking, the first reactive ion etching step can be any dry etching technique wherein a chemically reactive plasma is generated by an electromagnetic field, which accelerates high-energy plasma ions towards the main surface 202 surface of the semiconductor wafer 200. In some examples, the first reactive ion etching step can be a so-called deep reactive ion etch process such as a Bosch process or a cryogenic process. The high-energy plasma ions collide with the exposed portions of the semiconductor wafer 200, and thus remove semiconductor material through the first set of openings 212. As a result of the first reactive ion etching step, a first group of trenches 214 that extend from the main surface 202 into the semiconductor wafer 208 is formed.

Figure 3:
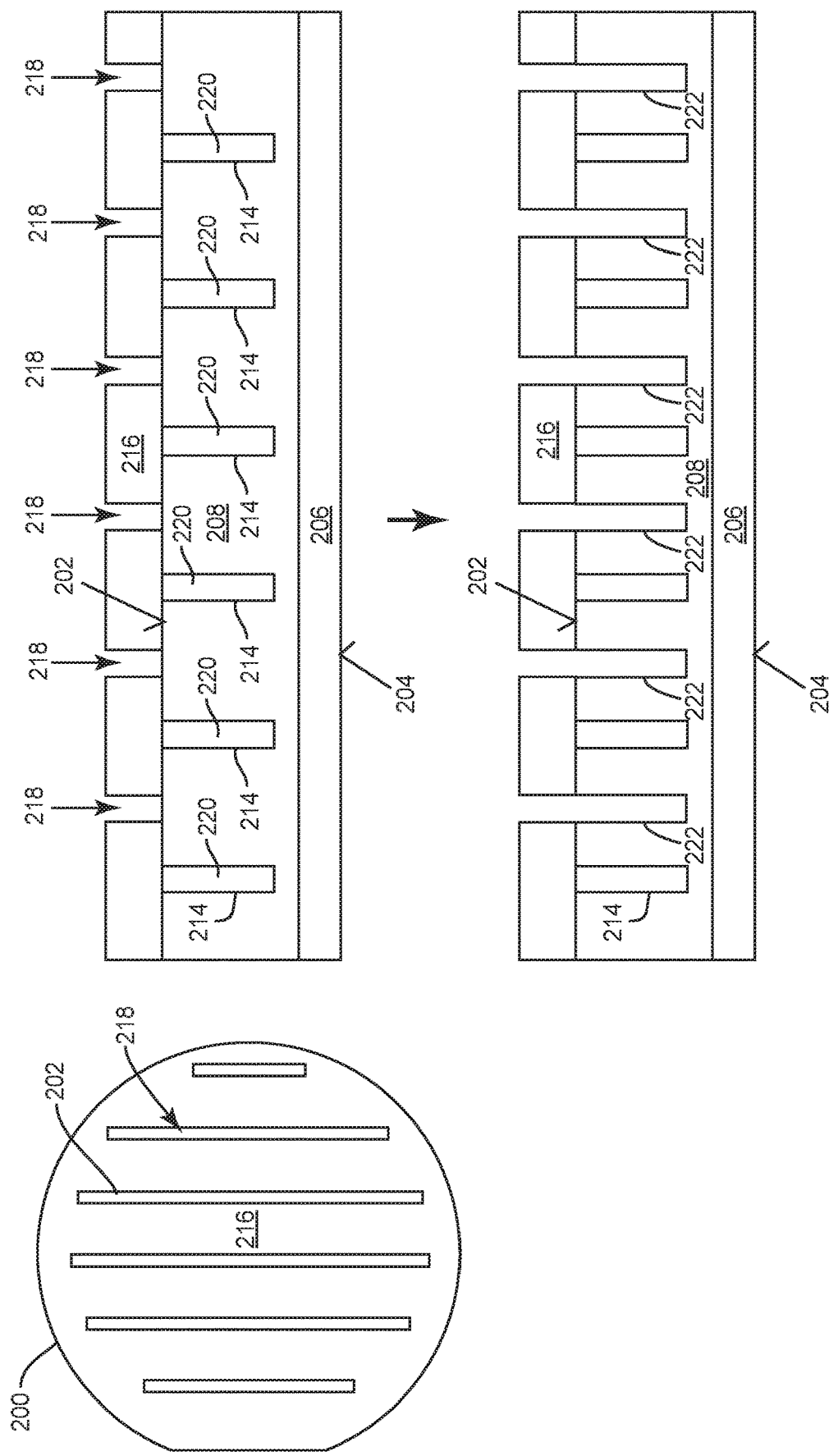
FIG. 3 illustrates a second reactive ion etching step in a method of forming a semiconductor device, according to an embodiment.

Referring to FIG. 3, after performing the first reactive ion etching step, each of the trenches 214 in the first group are covered with a second etch resistant mask 216. Generally speaking, the second etch resistant mask 216 can be any material that effectively blocks energized plasma ions in a reactive ion etching process. This material can include any of the hardmask or photoresist materials previously described. The second etch resistant mask 216 can be, but is not necessarily, formed from the same material as the first etch resistant mask 210. Moreover, while the figure shows the second etch resistant mask 216 formed directly on the semiconductor wafer 200, in some embodiments to be described in further detail, the first etch resistant mask 210 remains on the semiconductor wafer 200 after the first reactive ion etching step and the second etch resistant mask 216 is formed over the first etch resistant mask 210.

The second etch resistant mask 216 is formed to completely cover each of the trenches 214 in the first group. According to an embodiment, prior to forming the second etch resistant mask 216, the first group of trenches 214 are filled with a filler material 220. Generally speaking, the filler material 220 can include a wide variety of different materials, including conductors, electrical insulators, and semiconductors. Exemplary filler materials 220 include dielectrics e.g., silicon dioxide $SiO_2$, and polycrystalline semiconductors (e.g., polysilicon) and photoresist materials, to name a few. Moreover, each trench can be filled with more than one type of material. The filler material 220 provides, among other things, a physical base for the second etch resistant mask 216 to be formed thereon. Moreover, these filler materials 220 can provide further protection of the first group of trenches 214 from etchant particles.

The second etch resistant mask 216 is patterned to include a second set of openings 218 that expose the main surface 202. The second set of openings 218 provide a desired trench geometry for a second group of trenches 222 that are each laterally offset from the trenches 214 of the first group. In the depicted embodiment, the second etch resistant mask 216 is formed directly on the semiconductor wafer 200 such that the main surface 202 is directly exposed by the second set of openings 218 in the second etch resistant mask 216. However, as previously explained, in other embodiments to be explained in further detail below, the second etch resistant mask 216 is formed over the first etch resistant mask 210. In that case, the second set of openings 218 are formed in the first etch resistant mask 210 as well, and the second set of openings 218 in the second etch resistant mask 216 are formed to align with the subjacent second set of openings 218 in the first etch resistant mask 210.

After forming the second etch resistant mask 216, a second reactive ion etching step is performed. Generally speaking, the second reactive ion etching step can be any dry etching technique wherein a chemically reactive plasma is generated by an electromagnetic field, which accelerates high-energy plasma ions towards the main surface 202 of the semiconductor wafer 200. In some examples, the second reactive ion etching step can be a so-called deep reactive ion etch process such as a Bosch process or a cryogenic process. The second reactive ion etching process can be, but is not necessarily, performed according to the same technique and same process parameters as the first reactive ion etching process. The high-energy plasma ions collide with the exposed portions of the semiconductor wafer 200, and thus remove semiconductor material through the second set of openings 218. As a result of the second reactive ion etching step, a second group of trenches 222 that extend from the main surface 202 into the semiconductor wafer 208 is formed. Each of the trenches 222 from the second group are laterally separated from each of the trenches 214 from the first group, meaning that these trenches are spaced apart from one another in a lateral direction that is parallel to the main surface 202.

According to an embodiment, the first and second reactive ion etching processes are performed such that a depth of the trenches 214 in the first group is substantially equal to a depth of the trenches 222 in the second group. This means that the first and second reactive ion etching processes are carried out in such a way to make the depth of the trenches 214, 222 as close to one another as is practically achievable. For example, the process conditions of the first and second first reactive ion etching processes (e.g., electromagnetic frequency, RF power, pressure, gas flow rate, temperature, time, etc.) can be selected to be identical to one another. Moreover, the first and second reactive ion etching processes can each be performed using the same etching tool thereby eliminating tool calibration as a potential source of trench depth variation.

Generally speaking, the multi-step reactive ion etching technique can be used to form trench structures for a wide variety of semiconductor devices. That is, the trenches formed according to this technique can serve many different purposes. For example, these trenches can be subsequently filled with any one of: an electrical insulator, an electrical conductor and a semiconductor. In some examples, after the multi-step reactive ion etching technique is performed, some or all of the trenches from both groups are processed to form identical structures, such as trench isolation structures, buried contact structures, and through silicon vias (TSVs), to name a few. In one example, after performing the first and second reactive etching processes, field plate structures are formed in the trenches 214, 222 from both of the first and second groups. These field plate structures are formed to have the same characteristics, i.e., dielectric thickness, electrode material, etc. Meanwhile, active semiconductor devices can be formed in the semiconductor mesas between the trenches using commonly known techniques. The field plate structures can be integral components of these active semiconductor devices. This means that one of the field plate structures is disposed directly adjacent to the drift path of the device (e.g., as shown in FIG. 1) and the field plate is electrically connected to at least one device terminal so that the above described compensatory benefit can be realized. As a result, a device similar or identical to the power semiconductor device 100 described with reference to FIG. 1 is provided.

Figure 4:
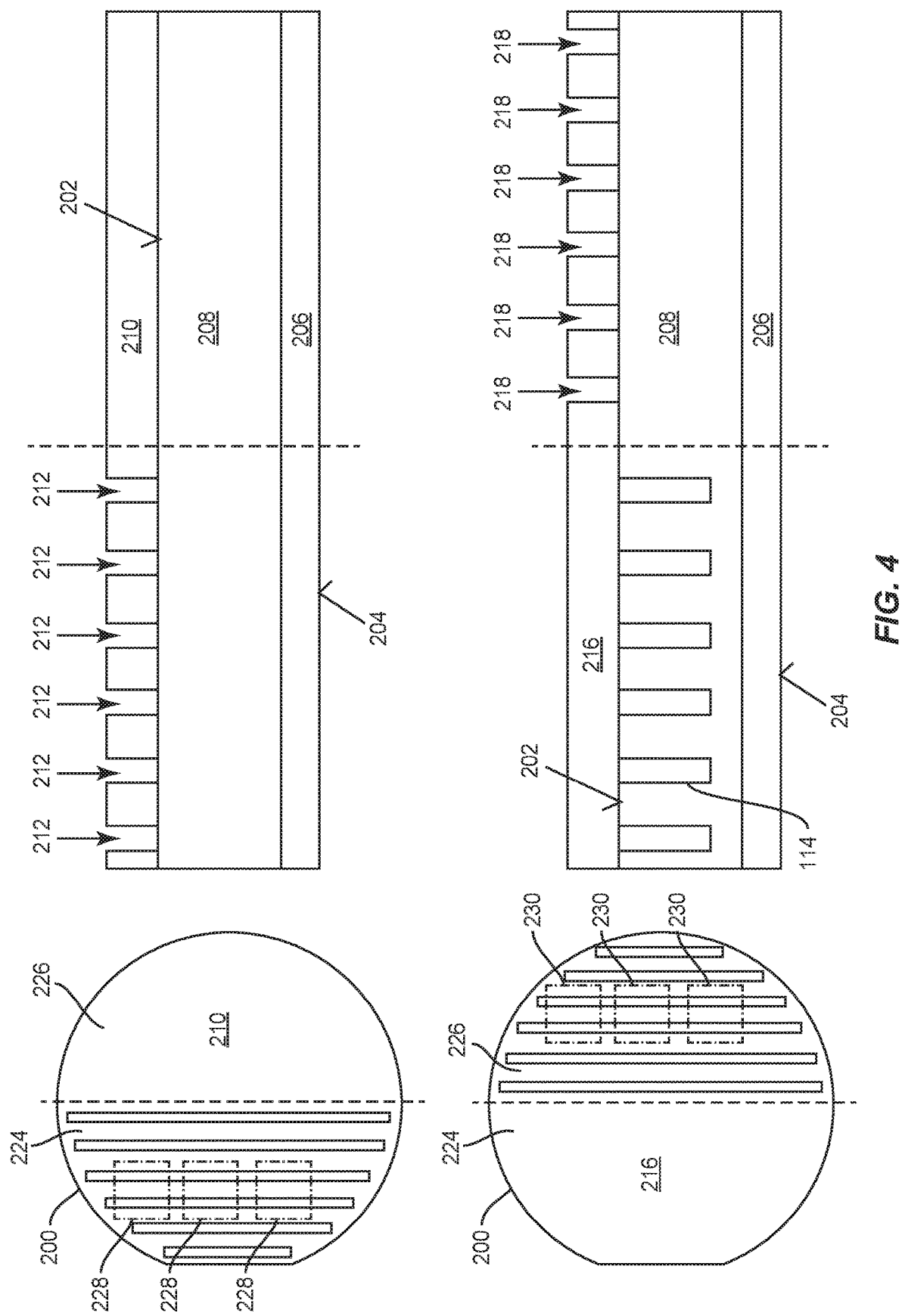
FIG. 4 illustrates alternative mask patterns for the first and second reactive ion etching steps in a method of forming a semiconductor device, according to an embodiment.

The above described two-step technique advantageously reduces the amount of wafer surface area that is exposed to etchant particles at any one time in comparison to a single step etching technique for the same amount of trenches per unit area. In one exemplary application, 70% of the surface area of the wafer must be exposed during etching to form all of the necessary identically dimensioned field plate trenches in a semiconductor wafer. In the example of FIGS. 3-4, the wafer surface area that is exposed to etchant particles during the first reactive ion etching step is the total area of the main surface 202 that is exposed by the first openings 212 and the wafer surface area that is exposed to etchant particles during the second reactive ion etching step is the total area of the main surface 202 that is exposed by the second openings 218. This means that the exposed surface area value at a given reactive ion etching step can be as low as 35% for the formation of the necessary trenches in the above mentioned exemplary application. This value assumes that exactly half of the surface area necessary to form the trenches is exposed during the first reactive ion etching step and the other half of the surface area is exposed during the second reactive ion etching step. This is not a requirement, however. More generally, the amount of surface area exposed during each step can vary, e.g., by forming more trenches and/or larger footprint trenches during one of the two etching steps. In any case, a reduction in exposed surface area is realized by bifurcating the process.

Corresponding principles may be used to perform a multi-step reactive ion etching technique with more than two reactive ion etching steps, thereby enabling a further reduction in exposed surface area during any one step. For example, according to an embodiment, after performing the second reactive ion etching step as described above, a third reactive ion etching process is performed. The third reactive ion etching process forms a third group of trenches (not shown) that each extend from the main surface 202 into the semiconductor wafer 200 and are each laterally offset from the trenches 214, 222 in the first and second groups. The same concepts as described above with reference to the first and second reactive ion etching process can be applied to carry out this process. That is, a third mask of etch resistant material (either hardmask or photoresist) can be formed on the semiconductor wafer 200 so as to cover each trench 214, 222 in the first and second groups and patterned to include a third set of openings. The trenches 214, 222 in the first and second groups may be filled in a similar manner as previously described. A third reactive ion etching step is performed with the third mask being present on the wafer in a similar manner as previously discussed. These same principles can be used to perform more than three reactive ion etching steps, e.g., four, five, six, etc. An exposed surface area reduction is realized for each additional reactive ion etching step. Assuming an equal amount of exposed surface area during each etching step, a reduction in exposed surface of (1−1/N) can be achieved, where N=the number of separate masks used for different reactive ion etching steps. Thus, a two-step process can provide a maximum reduction of 50% in exposed surface area, a three-step process can provide a maximum reduction of 66% in exposed surface area, and so forth.

According to an embodiment, the overall surface area of the main surface 202 that is exposed to etchant particles during each one of the above described reactive ion etching processes is maintained below a targeted value. For example, in the case of a two-step reactive ion etching process, the first and second openings 212, 218 can be formed so that at least 40% of the surface area of the main surface 202 (i.e., the targeted value) of the semiconductor wafer 200 is covered by etch resistant material during each of the first and second reactive etching steps. Similarly, this target can be used in the above described three step process such that none of the etching steps expose more than 40% of the surface area. This produces an advantageous reduction in trench depth variation. The inventors believe that maintaining the surface are below this value provides a noticeable improvement in trench depth variation, as it represents the limit at which the process tool can effectively remove etched material during the process. The exact surface area value at which this improvement may vary depending upon a variety of factors that are specific to the etching tool being used. More generally, the targeted surface area value can be any value that is desired to achieve a given trench depth variation, e.g., 50%, 60%, etc.

Referring to FIG. 4, a multi-step reactive ion etching technique is shown, according to another embodiment. The method of FIG. 4 can be identical to the method described with reference to FIGS. 3-4 with the only exception being the locations of the trenches that are formed by the first and second reactive ion etching processes. In more detail, according to the technique described with reference to FIGS. 3-4, the trenches 214 in the first group are formed alternatingly with the trenches 222 in the second group. That is, the first and second sets of openings 212, 218 are patterned in such a way that no two trenches from either group are directly adjacent to one another. By contrast, in the method of FIG. 4, the first and second groups of trenches 214, 222 are formed in separate lateral regions of the semiconductor wafer 200 that are non-overlapping and adjacent to one another. In other words, all of the trenches 214 in the first group are laterally separated from all of the trenches 222 in the second group.

As shown in the FIG. 4, the semiconductor wafer 200 is divided into two lateral regions, namely, a first lateral region 224 (i.e., the left half of the wafer), and a second lateral region 226, (i.e., the right half of the wafer). The first etch resistant mask 210 is formed according to the previously described techniques such that the first set of openings 212 expose only portions of the main surface 202 in the first lateral region 224. Meanwhile, the second lateral region 226 is completely covered by the first etch resistant mask 210. The first reactive ion etching process can be performed in the previously described manner thereby forming the first group of trenches 214. Subsequently, the second etch resistant mask 216 is provided according to the previously described techniques such that the first lateral region 224 is completely covered by the second etch resistant mask 216. Meanwhile, in the second lateral region 226, the main surface 202 is exposed from the second etch resistant mask 216 and, if present, the first etch resistant mask 210, by the second set of openings 218. The second reactive ion etching process can be performed in the previously described manner so as to form the second group of trenches (not shown in FIG. 4).

One potential advantage of the separate lateral region approach of FIG. 4 is the capability of isolating the trenches of each etching process to individual semiconductor dies. That is, the designer can ensure that one semiconductor die formed in the semiconductor wafer 200 includes only trenches formed by the first reactive ion etching step and not the second reactive ion etching step, and vice-versa. As shown in FIG. 4, the semiconductor wafer 200 includes a first set of die sites 228 and a second set of die sites 230. These die sites 228, 230 correspond to the location of individual semiconductor dies that are singulated from the semiconductor wafer 200 once processing is complete. As can be seen, the first set of die sites 228 includes only trenches formed from the first reactive ion etching process, whereas the second set of die sites 230 includes only trenches formed from the second reactive ion etching process.

More generally, the locations of the various groups of trenches associated with each reactive ion etching step can differ from what is shown to meet any of a variety of desired choices. For example, the semiconductor wafer 200 can be divided into quadrants, with only one group of trenches being formed in each quadrant at one time. Instead of a single alternating configuration, the masks can be configured so that two successive trenches from the first group alternate with two successive trenches 222 in the second group. The masking can be configured to isolate single dies for a unique trench formation step that is specific to that die.

The different options for the location of the trenches as described above allow the designer to mitigate any issues relating to trench depth variation as between the different reactive ion etching steps. Using the alternating arrangement of the first and second groups of trenches as described with reference to FIGS. 3-4 as an example, while the multi-step trench etching process provides a reduction in the trench depth process window for the trenches in both groups, because the first and second groups of trenches 214, 222 are formed by temporally separate processes, the depth of two immediately adjacent trenches may not be identical. Put another way, the multi-step aspect of the process introduces an element of variability as two separate steps are used to form trenches with the same desired dimensions. In some cases, it may be beneficial to relegate this variability to different chips, e.g., using the process described with reference to FIG. 4. In other cases, the variability is more preferably shared evenly amongst chips, e.g., using the technique described with reference to FIGS. 3-4. Ultimately, choice of which technique is preferable depends upon a variety of application specific requirements.

Referring again to FIG. 1, the benefit of the above described technique can be used to tailor the thickness of the drift region 114 of the power semiconductor device 100 in a beneficial manner. As previously explained, the maximum target trench depth (TD) is directly dependent upon the trench depth process window (PW). Moreover, the trench depth process window (PW) is correlated to the amount of surface area of the semiconductor wafer that is exposed during etching. This means that reducing the amount of exposed surface area during etching leads directly to an improvement in the trench depth process window.

Thus, the correlation between the trench depth process window (PW) and the amount of exposed surface area can be used to increase the maximum target trench depth (TD) to a greater value than what would otherwise be possible, and/or to reduce the thickness of the epitaxial layer while maintaining the necessary separation distance between the trench and the epitaxial layer/substrate interface. For example, in one embodiment, the correlation is used by selecting a fixed value for the percentage surface area of the main surface that is covered to derive the variation in the depth of the trenches. This derivation can be obtained from empirically derived data regarding the correlation between trench depth variation and exposed surface area for a given process tool. Subsequently, the minimum distance D2 as described above is selected based upon the determined trench depth variation. The minimum distance D2 is selected so that the deepest vertical trench 122 formed in the semiconductor wafer 200 is separated from the drain region 110 by at least the first minimum distance D1. Put another way, the maximum target trench depth is moved closer to the drain region 110, due to the improvement in trench depth variation. This benefit can be leveraged to produce a better performing device by reducing the thickness of the drift region 114, thereby reducing the on-resistance of the device, while maintaining the same reverse blocking rating.

In another example, the correlation is used by selecting a fixed value for the trench depth variation to derive a necessary percentage surface area of the main surface that is covered during each of the first and second reactive ion etching processes to obtain the fixed value for the trench depth variation. That is, the designer begins with a target value for the trench depth process window (PW) and obtains a value corresponding to the necessary percentage surface area of the main surface that must be covered to ensure that the target value is met. This derivation can be obtained from empirically derived data regarding the correlation between trench depth variation and exposed surface area for a given process tool. In one embodiment, the fixed value is selected to be 7%, meaning that the depth of the deepest vertical trench 122 in the semiconductor wafer 200 does not exceed the depth of the shallowest vertical trench 122 by more than 7%. The designer then tailors the etching processes to ensure that the main surface 202 of the semiconductor wafer 200 is covered by at least the necessary percentage surface area during each of the first and second reactive ion etching processes. Tailoring the etching processes includes configuring the patterning of the etch resistant material and selecting the number of reactive ion etching steps necessary to ensure that the maximum exposed surface area value is not exceeded during any one etching step. For example, if the desired trench geometry can not be obtained in two reactive ion etching steps without exceeding the maximum exposed surface area value, the designer can add additional, identical reactive ion etching steps, e.g., according to the previously described multi-step techniques.

In the above example, the multi-step etching process is used to set the maximum target trench depth (TD) to ensure sufficient separation distance between the bottom of the vertical trenches 122 and an interface between the drift and drain regions 114, 110 of the device. More generally, the above described principles can be used to control the separation distance between a trench and any interface of the semiconductor wafer 200. As used herein, an interface refers to a location where two regions with different attributes (e.g., crystalline structure, doping concentration, material composition, etc.) meet one another, and also includes outer surfaces of a semiconductor wafer. For example, according to another embodiment, the multi-step etching process can be used to set the maximum target trench depth (TD) with reference to the rear surface 204 of the semiconductor wafer 200.

FIGS. 5-10 illustrate a reactive ion etching technique, according to an embodiment. In this embodiment, the first etch resistant mask 210 is initially patterned to include the first and second sets of openings 212, 218. Advantageously, by defining the geometry of the first and second sets of openings 212, 218 in one common lithography step, differences in the critical dimensions (i.e., trench width) between the trenches 214, 222 in the first and second groups can be minimized, as well as misalignment issues can be mitigated.

Figure 5:
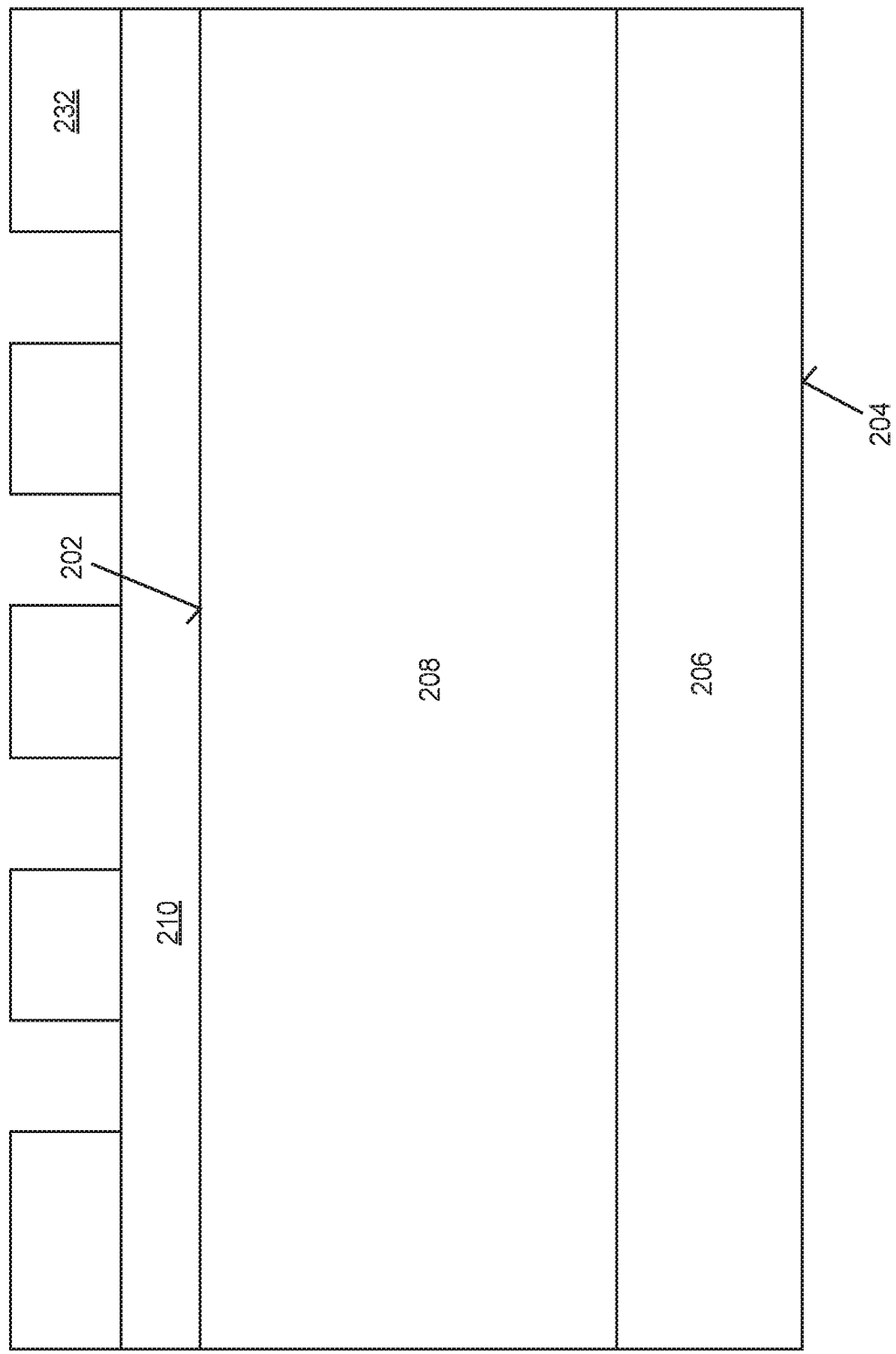
FIG. 5 illustrates forming a first hard mask layer and a first photoresist mask on a semiconductor wafer, according to an embodiment.

Referring to FIG. 5, the semiconductor wafer 200 is provided and the first etch resistant mask 210 is formed on the main surface 202 of the semiconductor wafer 200. In this example, the first etch resistant mask 210 is formed from a layer of hardmask material. More particularly, the first etch resistant mask 210 can be formed as layer of silicon dioxide ($SiO_2$) that completely covers the main surface 202, e.g., using a tetraethyl orthosilicate (TEOS) based deposition process, or a thermal oxidation process. Subsequently, a first patterned photoresist mask 232 is formed on the first etch resistant mask 210. The first patterned photoresist mask 232 is formed using a first photolithography process, which can be a positive or negative photolithography technique. The first patterned photoresist mask 232 can include any of a variety of photoresist materials, such as photopolymeric photoresist, photodecomposing photoresist and photocrosslinking photoresist. The first patterned photoresist mask 232 is patterned to include locations of the first and second sets of openings 212, 218. In other words, the desired trench geometry of the first and second groups of trenches 214, 222 is formed in the first patterned photoresist mask 232.

Figure 6:
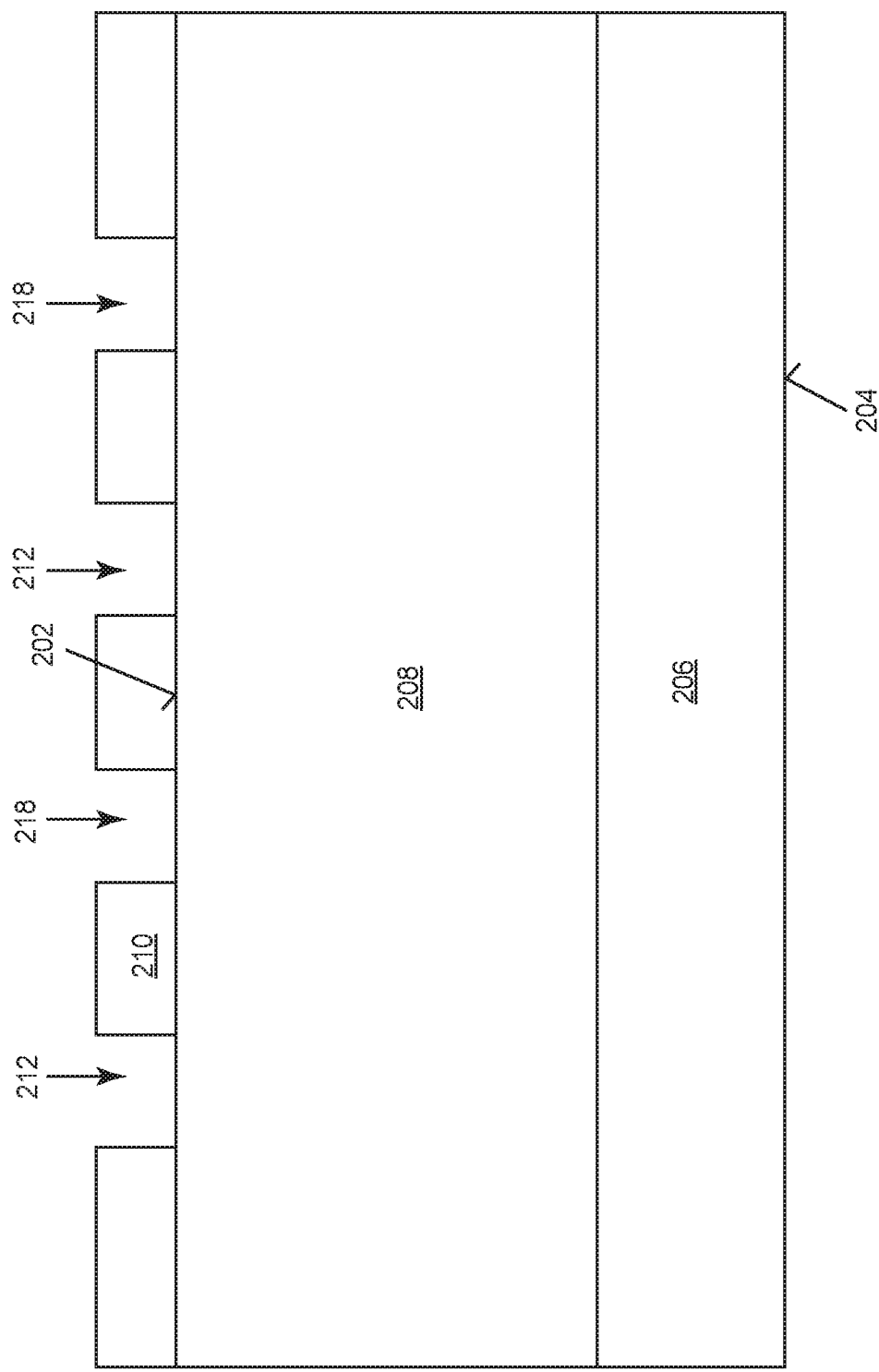
FIG. 6 illustrates forming first and second sets of openings in the first hard mask layer, according to an embodiment.

Referring to FIG. 6, the first and second sets of openings 212, 218 are formed in the first etch resistant mask 210 using the first patterned photoresist mask 232. This can be done by an etching technique, such as a wet chemical etch or a reactive ion etch (RIE). After forming the first and second sets of openings 212, 218, the first patterned photoresist mask 232 is removed using, e.g., a wet chemical technique or an ashing technique.

Figure 7:
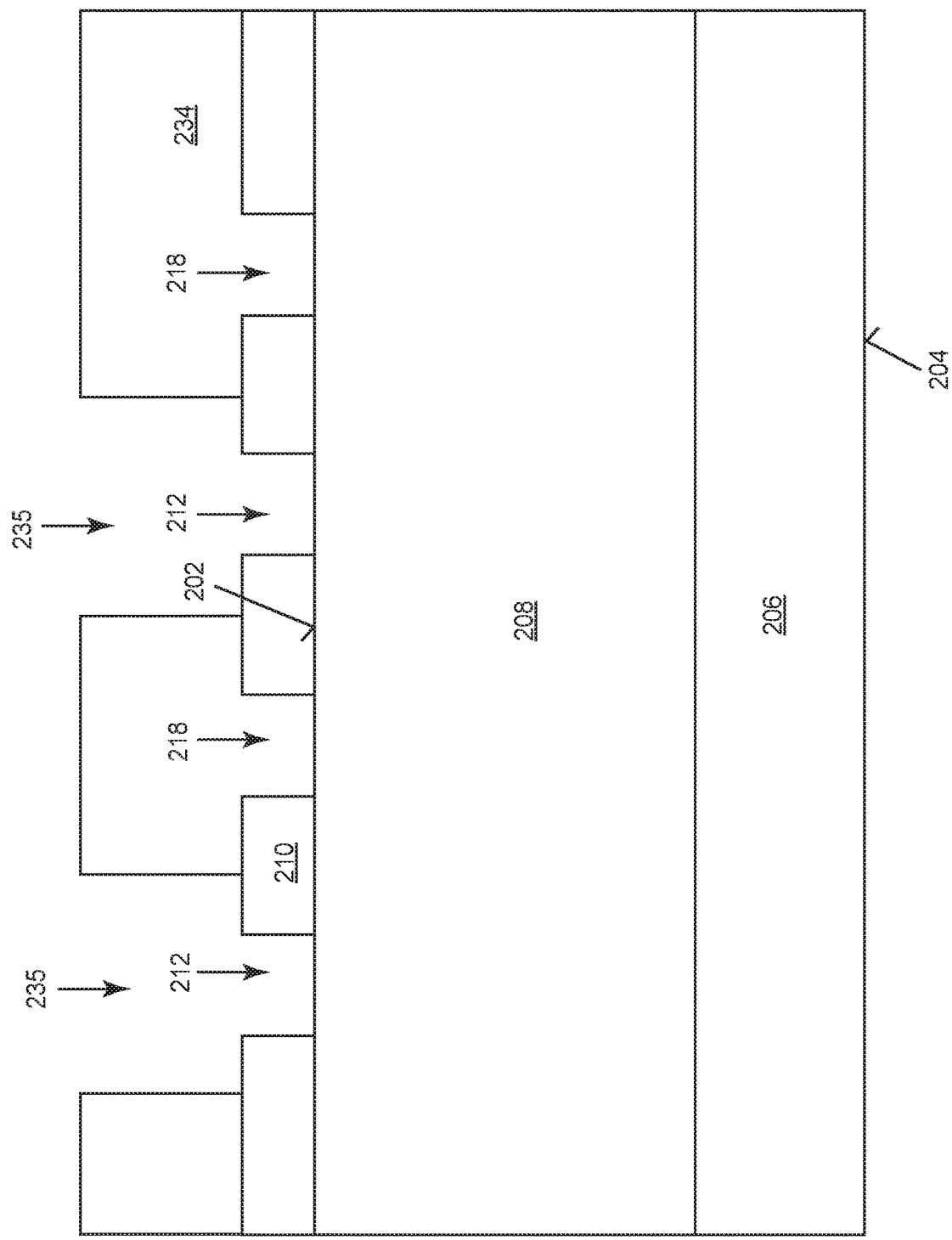
FIG. 7 illustrates forming a second photoresist mask that fills the second set of openings, according to an embodiment.

Referring to FIG. 7, after removing the first patterned photoresist mask 232, a second patterned photoresist mask 234 is formed on the first etch resistant mask 210. The second patterned photoresist mask 234 is formed using a second photolithography process, which can be a positive or negative photolithography technique. The second patterned photoresist mask 234 can include any of a variety of photoresist materials, such as photopolymeric photoresist, photodecomposing photoresist and photocrosslinking photoresist. The second patterned photoresist mask 234 is formed in such a way that it completely fills the second set of openings 218 in the first etch resistant mask 210. Moreover, the second patterned photoresist mask 234 is patterned to include a corresponding set of openings 235 that are aligned with the first set of openings 212 and at least as large as the first set of openings 212. In other words, the second photolithography process fills the second set of openings 218 while leaving the main surface 202 exposed by the first set of openings 212.

Figure 8:
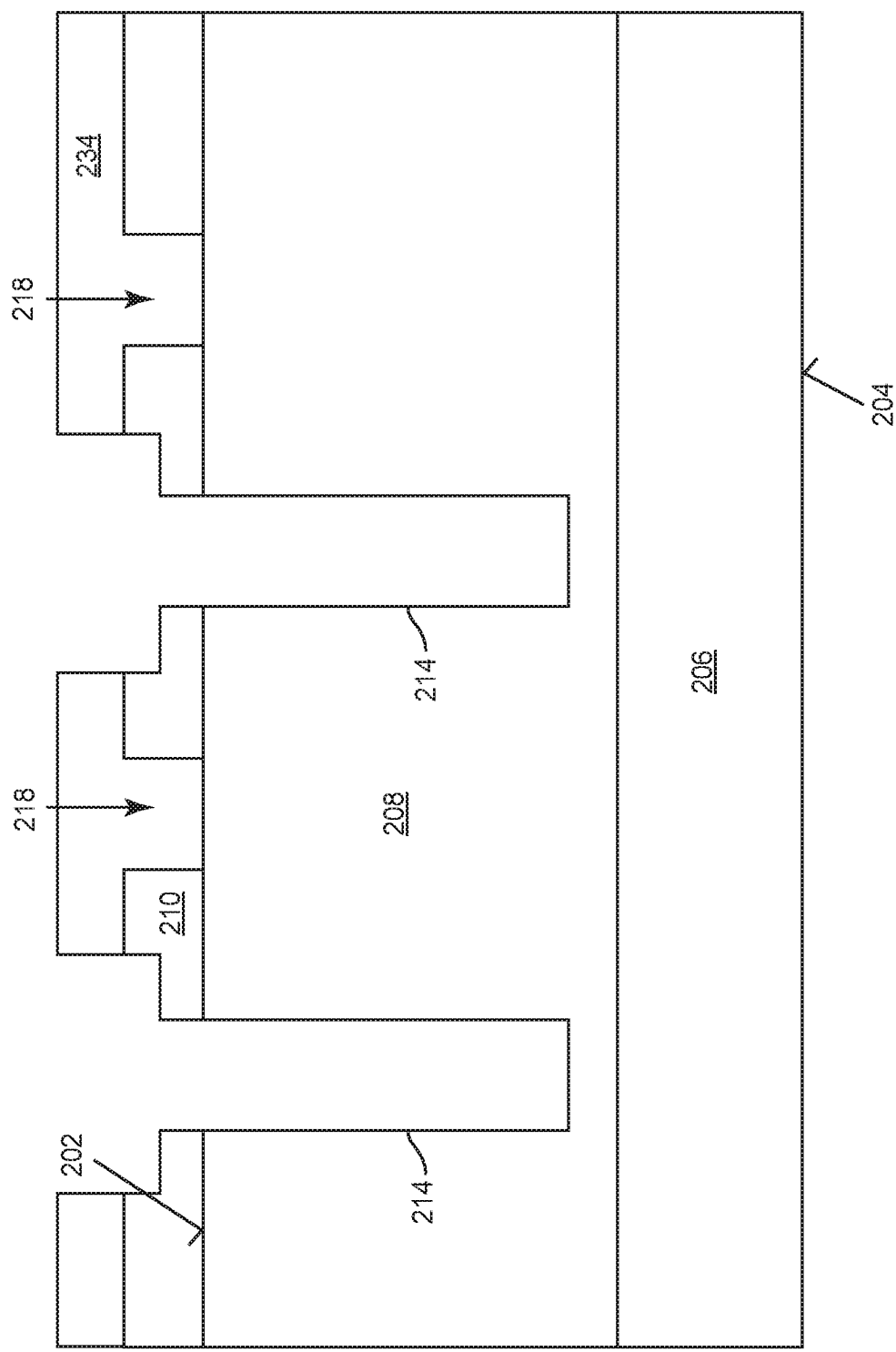
FIG. 8 illustrates forming a first group of trenches by performing a first reactive ion etching step, according to an embodiment.

Referring to FIG. 8, the first reactive ion etching process is performed with the first etch resistant mask 210 and the second patterned photoresist mask 234 being intact. As a result, each of the trenches 214 in the first group are formed. Meanwhile, due to the presence second patterned photoresist mask 234, trenches do not form underneath the second set of openings 218. After forming the first group of trenches 214, the second patterned photoresist mask 234 may be removed using, e.g., a wet chemical technique or an ashing technique.

Figure 9:
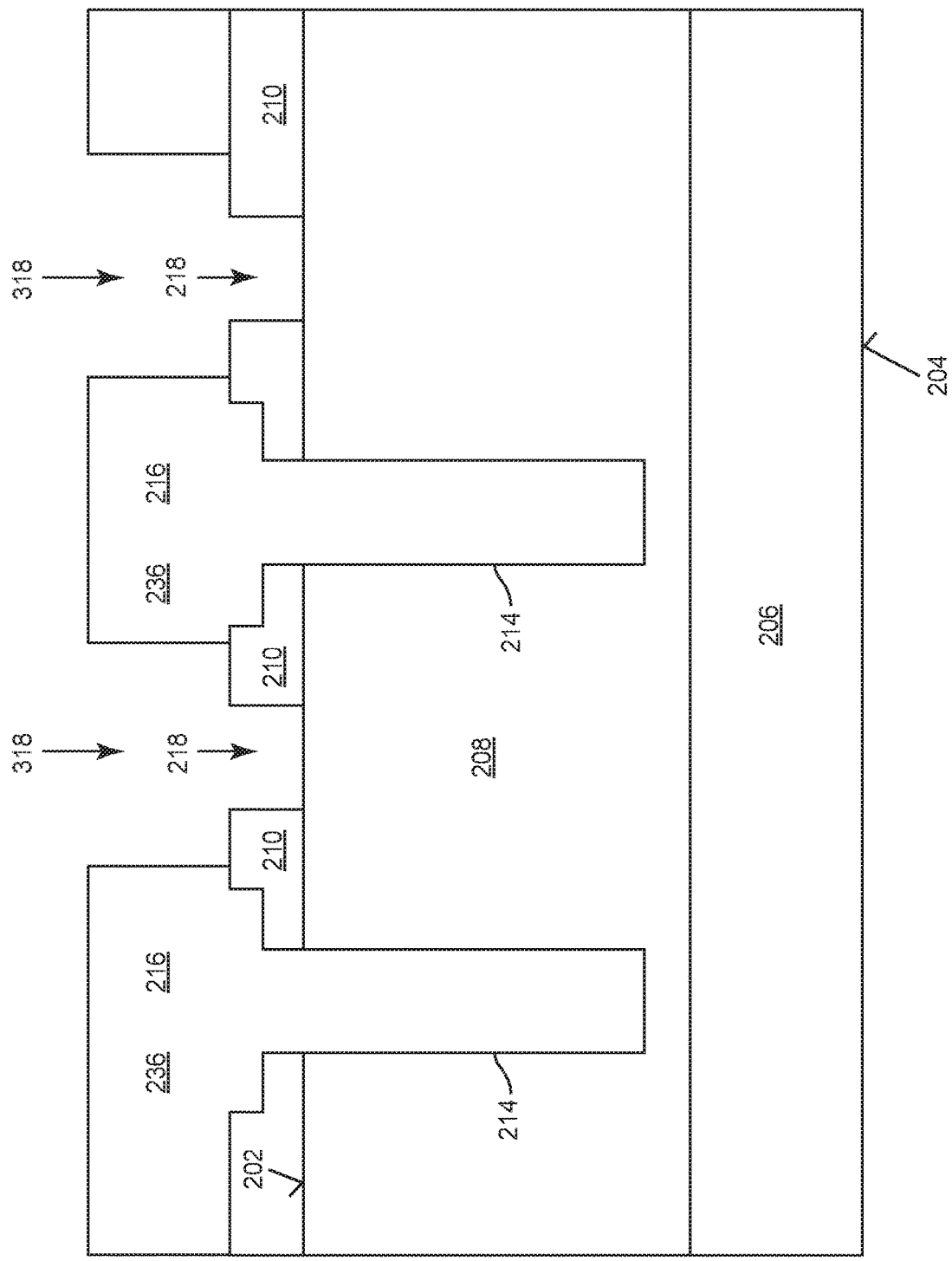
FIG. 9 illustrates forming a third photoresist mask that fills the trenches of the first group, according to an embodiment.

Referring to FIG. 9, the second etch resistant mask 216 is formed. In the depicted embodiment, this is done after removing the second patterned photoresist mask 234. In another embodiment (not shown), the second patterned photoresist mask 234 remains intact and the second etch resistant mask 216 is formed over the second patterned photoresist mask 234. In this example, the second etch resistant mask 216 is provided from a third patterned photoresist mask 236 that is formed on first etch resistant mask 210. The third patterned photoresist mask 236 is formed using a third photolithography process, which can be a positive or negative photolithography technique. The third patterned photoresist mask 236 can include any of a variety of photoresist materials, such as photopolymeric photoresist, photodecomposing photoresist and photocrosslinking photoresist. The third patterned photoresist mask 236 is formed to completely fill each of the trenches 214 in the first group. Depending on the dimensions (e.g., width and depth), a negative photolithography technique may be preferred in some embodiments to achieve complete filling of the trenches 214 with photoresist material. Alternatively, an intermediate step (not shown) to introduce alternative filler material into the trenches 214 is possible. The third patterned photoresist mask 236 is patterned to include a corresponding second set of openings 318 that are aligned with and at least as the second set of openings 218 in the first etch resistant mask 210. In other words, the second photolithography process fills each of the trenches 214 in the first group while leaving the main surface 202 exposed by the second set of openings 218.

Figure 10:
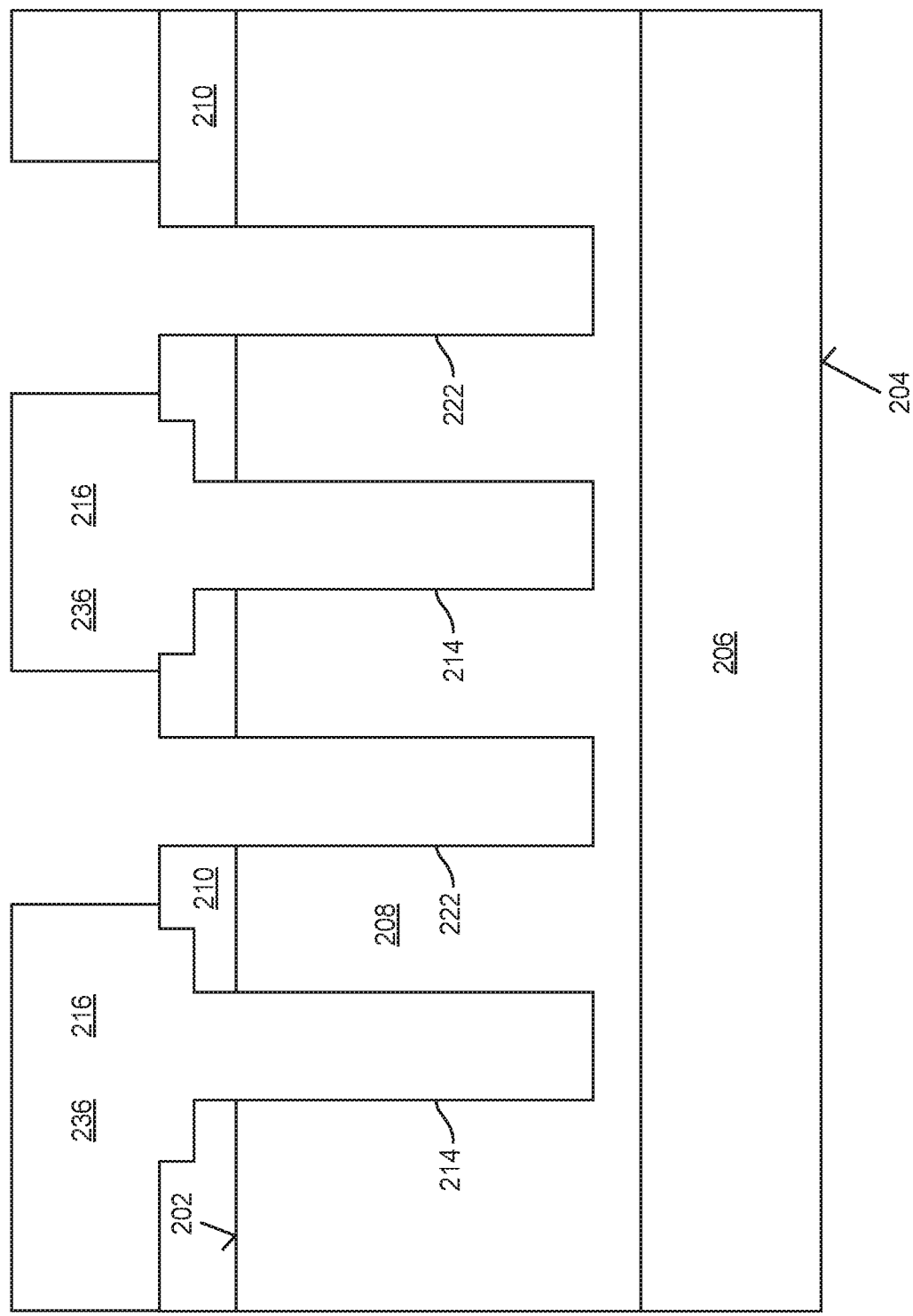
FIG. 10 illustrates forming a second group of trenches by performing a second reactive ion etching step, according to an embodiment.

Referring to FIG. 10, the second reactive ion etching process is performed with the first etch resistant mask 210 and the second etch resistant mask 216 intact. As a result, the trenches 222 of the second group are formed. Meanwhile, due to the presence of the second etch resistant mask 216, the etchant particles from the second reactive ion etching process do not alter the geometry of the first group of trenches 214. After forming the second group of trenches 222, the second etch resistant mask 216, i.e., the third patterned photoresist mask 236 is removed using, e.g., a wet chemical technique or an ashing technique. Additionally, the first etch resistant mask 210 is removed using, e.g., a wet chemical etching technique.

The thickness of the first etch resistant mask 210 is selected to withstand each reactive ion etching process that is performed (two, in this example) so that the main surface 202 remains protected from etchant particles throughout each etching step. This is dependent upon, among other things, the selectivity of the materials involved. In one example, the first and second reactive ion etching processes have a selectivity of approximately 1:20 as between the material of the first etch resistant mask 210 (silicon dioxide ($SiO_2$)) and the material of the first epitaxial layer 208 (silicon). In that case, the thickness of the first etch resistant mask 210, as measured from the main surface 202 to an opposite facing side of the first etch resistant mask 210, can be selected to be about 20% of the depth of the first group of trenches 214 (e.g., between 500 nm and 1 μm, and in particular 575 nm in one example). In a similar manner, the thicknesses of the second and third photoresist patterned masks 234, 236 are selected so that these masks can withstand the first and second reactive ion etching processes, respectively. In one example, the first and second reactive ion etching processes have a selectivity of approximately 1:5 as between the material of the second and third photoresist patterned masks 234, 236 (polymer) and the material of the first epitaxial layer 208 (silicon). In that case, the thicknesses of the second and third photoresist patterned masks 234, 236, as measured from a top surface of the first etch resistant mask 210 to an opposite facing surface, can be selected to be between 20% and 40% of the trench depth (e.g., approximately 1-2 μm, and in particular approximately 1.5 μm in one example).

FIGS. 11-17 depict a reactive ion etching technique, according to another embodiment. This technique offers fewer lithography steps in comparison to the technique described with reference to FIGS. 5-10. Different from the previously described technique, only the first sets of openings 212 are formed in the first etch resistant mask 210. The first etch resistant mask 210 is removed after the first reactive ion etching step and the second etch resistant mask 216 is subsequently formed directly on the semiconductor wafer 200.

Figure 11:
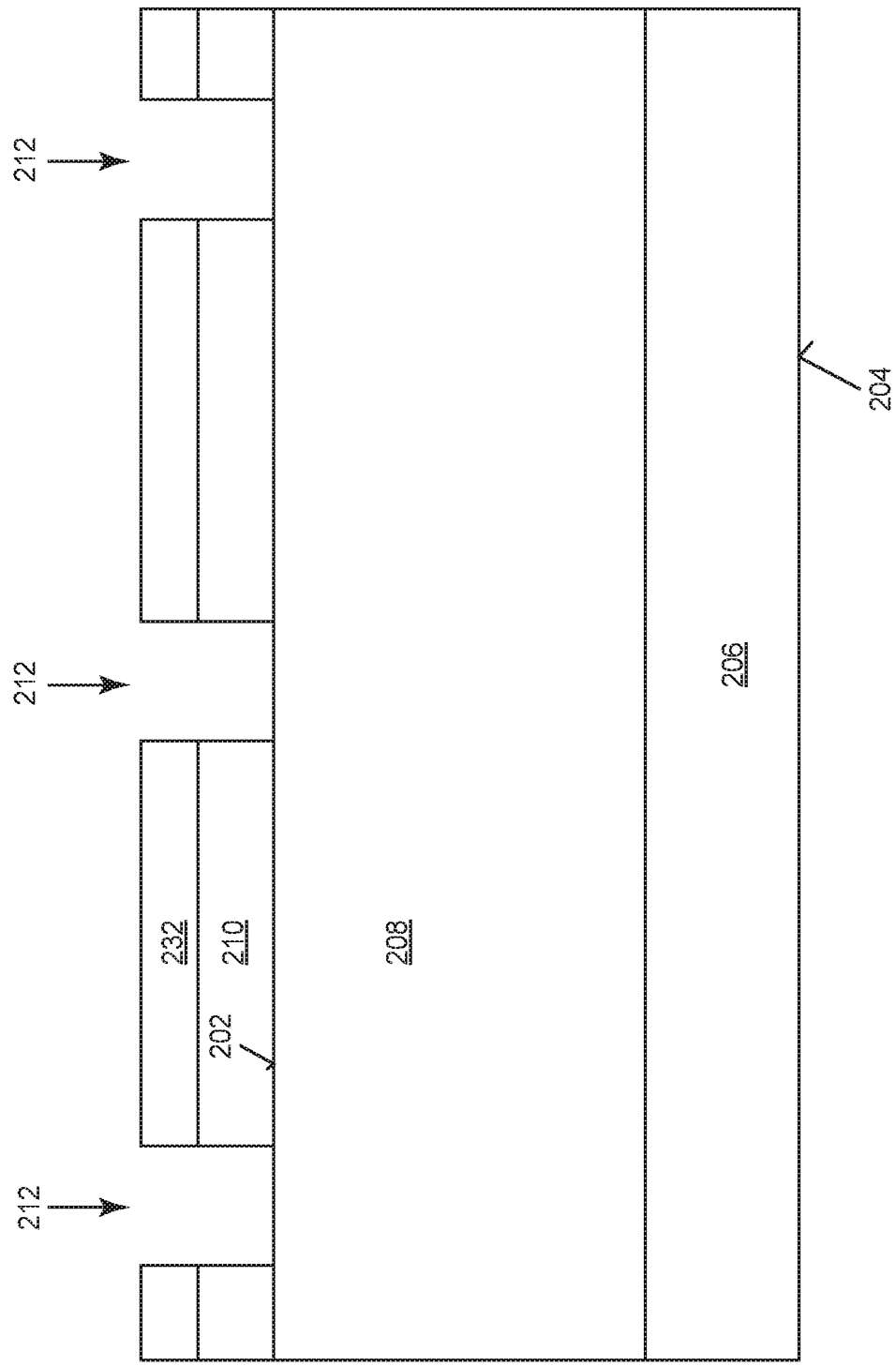
FIG. 11 illustrates forming only a first set of openings in the first hard mask layer, according to an embodiment.

Referring to FIG. 11, the semiconductor wafer 200 is provided and the first etch resistant mask 210 is formed on the main surface 202 of the semiconductor wafer 200. In this example, the first etch resistant mask 210 is formed from a layer of hardmask material, i.e., in the same manner as described with reference to FIG. 6. In this case, the first patterned photoresist mask 232 is patterned by the first photolithography process to only define locations of the first set of openings 212. That is, different to the previously described embodiment, the second openings are not formed in the first etch resistant mask 210. After forming the first patterned photoresist mask 232, the first set of openings 212 are formed in the previously described manner.

Figure 12:
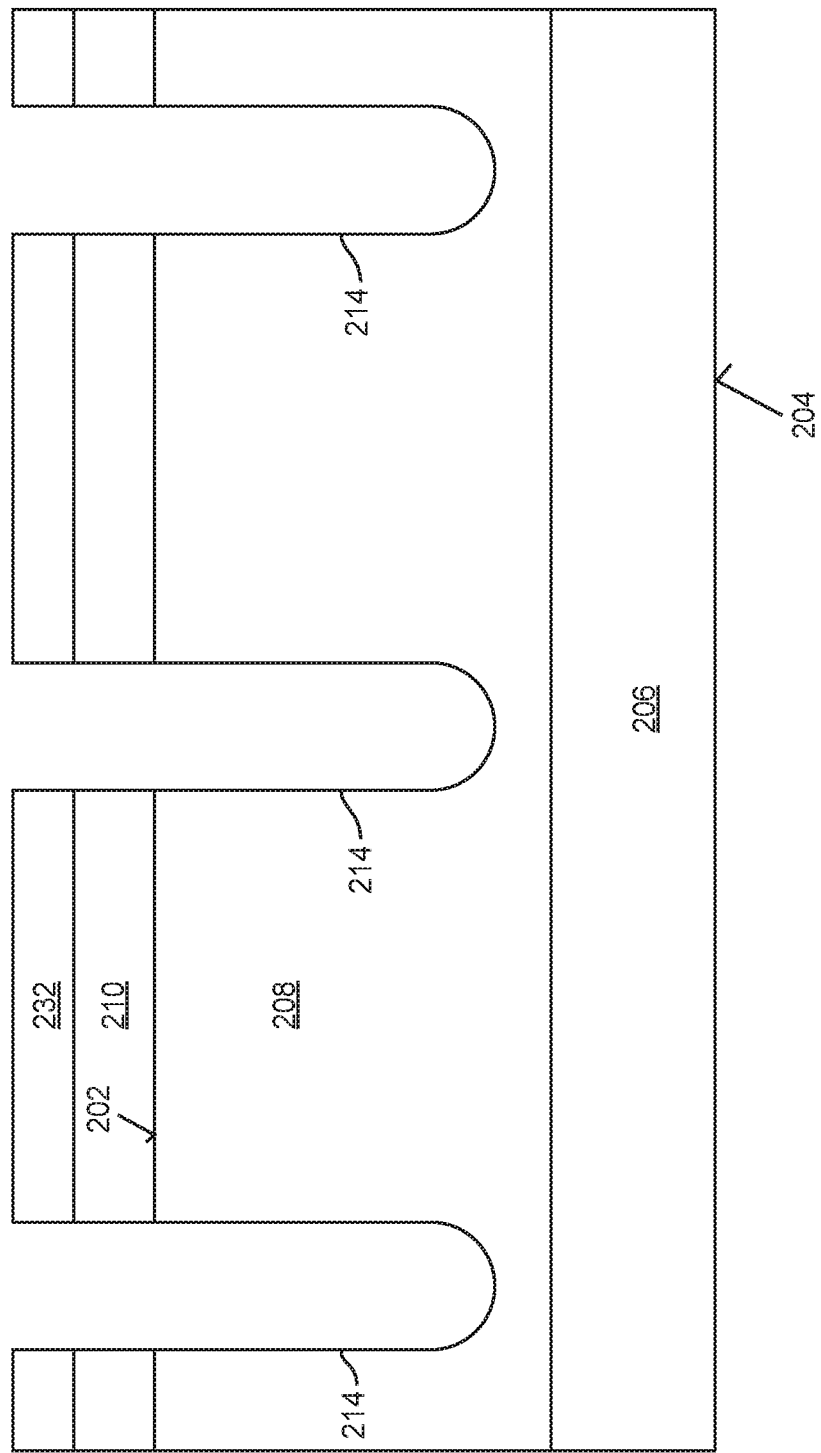
FIG. 12 illustrates forming a first group of trenches by performing a first reactive ion etching step, according to an embodiment.

Referring to FIG. 12, the first reactive ion etching process is performed. As a result, the first group of trenches 214 is formed in the semiconductor body 102. Subsequently, the first etch resistant mask 210 and the first patterned photoresist mask 232 can be removed, e.g., according to the previously described techniques.

Figure 13:
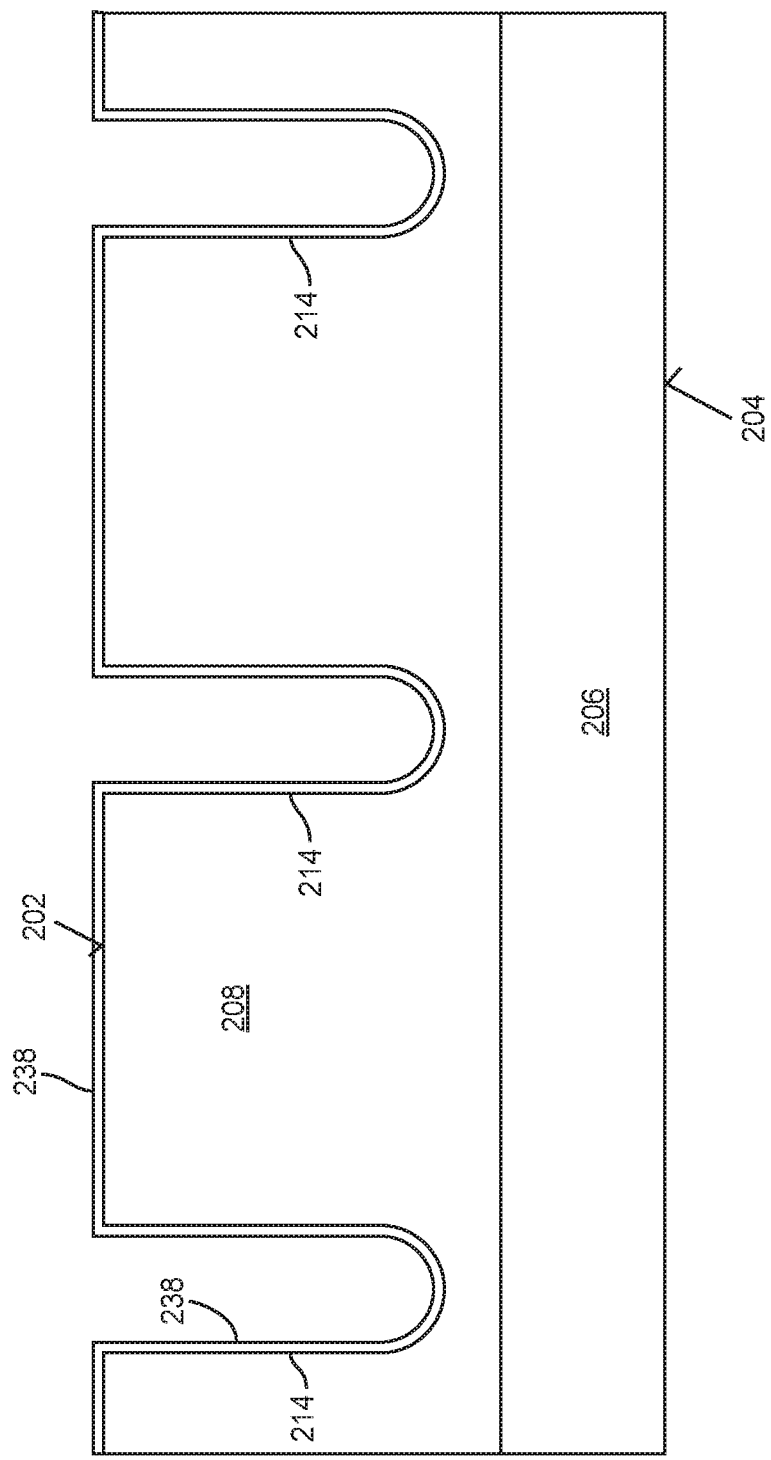
FIG. 13 illustrates forming a first dielectric layer that lines the trenches of the first group, according to an embodiment.

Referring to FIG. 13, after removing the first etch resistant mask 210 and the first patterned photoresist mask 232, a first dielectric layer 238 is conformally deposited on the exposed semiconductor surfaces of the semiconductor wafer 200, e.g., using a deposition technique such as chemical vapour deposition (CVD) or vapour phase deposition (VPD) or thermal oxidation technique. (e.g., rapid thermal oxidation (RTO) rapid thermal nitridation (RTN)). As a result of the deposition, the sidewalls and bottom of each trench 214 in the first group is lined by the first dielectric layer 238. Generally speaking, the first dielectric layer 238 can be any oxide or nitride material. Examples of these material includes (SiN), silicon dioxide ($SiO_2$) or silicon oxynitride ($SiO_xN_y$). The thickness of the layer of first dielectric layer 238 can generally be any desired value, and in one example is between approximately 30 nm and 60 nm.

Figure 14:
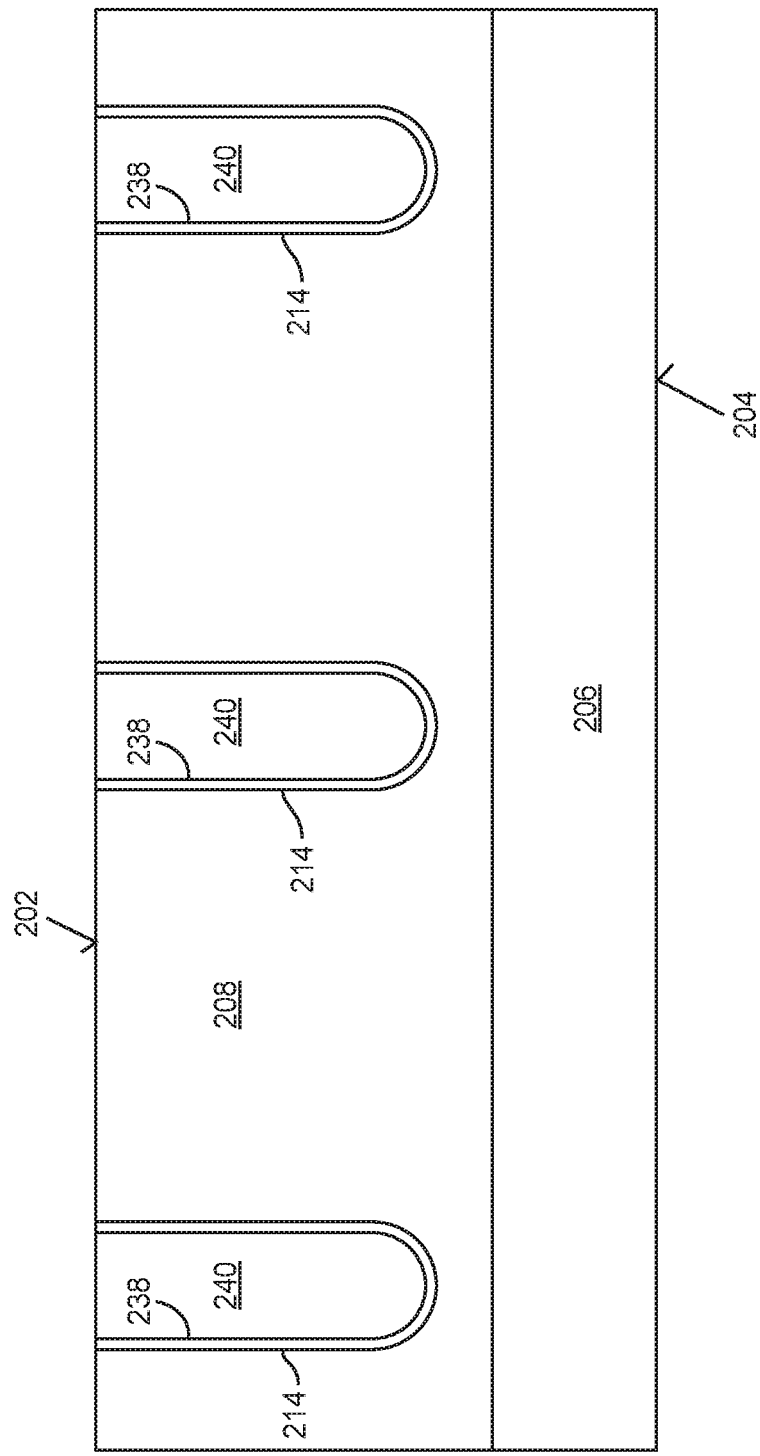
FIG. 14 illustrates filling the trenches in the first group with an electrical conductor and planarizing the wafer, according to an embodiment.

Referring to FIG. 14, each of the trenches 214 in the first group are filled with a first electrically conductive material 240. This first electrically conductive material 240 can be a polycrystalline semiconductor (e.g., polysilicon) or a conductive metal (e.g., aluminum or tungsten). In one example, the first electrically conductive material 240 is formed as a layer of polysilicon according to known techniques. The first electrically conductive material 240 is formed to be sufficiently thick to completely fill the trenches 214 in the first group. Subsequently, a planarization process is performed such that top sides of the first electrically conductive material 240 and the first dielectric layer 238 are coplanar with the main surface 202. Exemplary planarization techniques for this process include chemical mechanical planarization (CMP) and mechanical grinding, to name a few.

Figure 15:
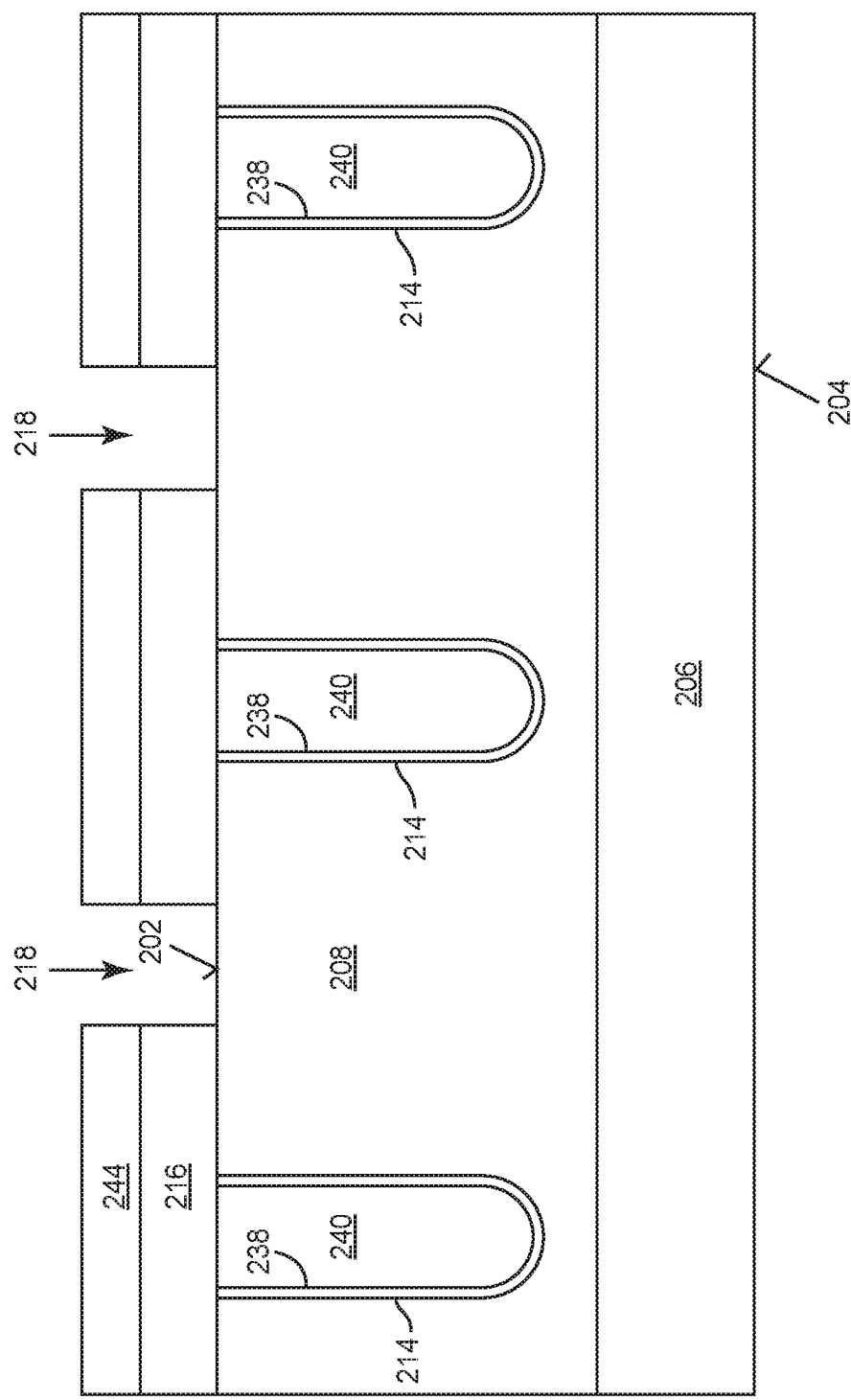
FIG. 15 illustrates forming a second hard mask layer and a second photoresist mask on a semiconductor wafer, according to an embodiment.

Referring to FIG. 15, after filling the trenches 214 in the first group and planarizing, the second etch resistant mask 216 is formed. In this example the second etch resistant mask 216 can be substantially similar or identical in composition and thickness as the first etch resistant mask 210. That is, the second etch resistant mask 216 formed as a layer of hardmask material, e.g., silicon dioxide ($SiO_2$). The second etch resistant mask 216 is formed to completely cover the main surface 202 as well as the top side of the first dielectric layer 238 and the first conductive material in the first group of trenches 214. Subsequently, a fourth patterned photoresist mask 244 is formed on the second etch resistant mask 216 using a second photolithography process. The second photolithography process can be performed according any of the previously described techniques, and the material of the fourth patterned photoresist mask 244 can include any of the previously described photoresist materials. The fourth patterned photoresist mask 244 is patterned to include the locations for the second group of openings 218. In other words, the desired trench geometry of the second group of trenches 222 is formed in the fourth patterned photoresist mask 244. Subsequently, the second group of openings 218 are formed in the second etch resistant mask 216 using the fourth patterned photoresist mask 244. This can be done by an etching technique, such as a wet chemical etch or a reactive ion etch (RIE).

Figure 16:
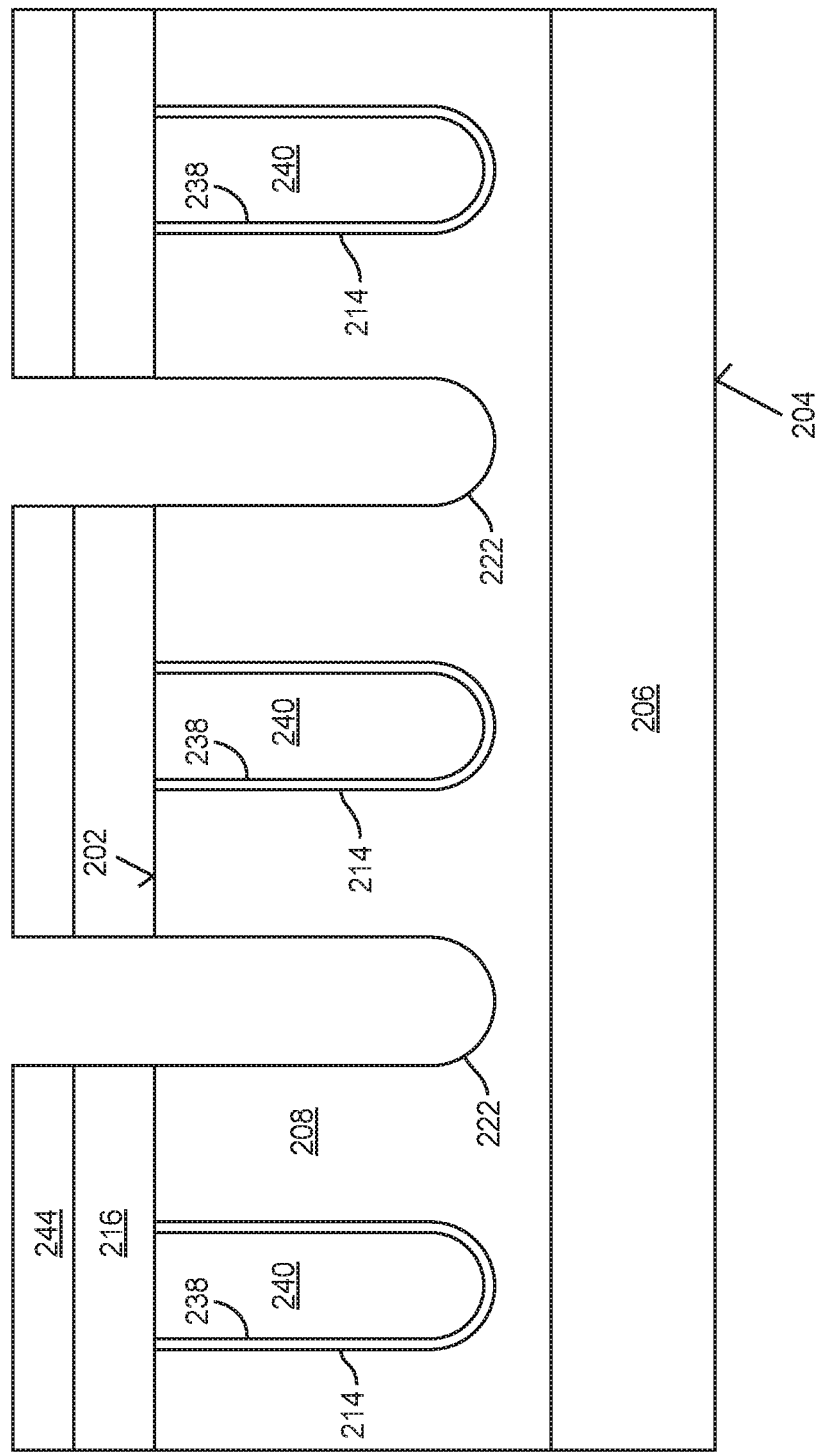
FIG. 16 illustrates forming a second group of trenches by performing a second reactive ion etching step, according to an embodiment.

Referring to FIG. 16, the second reactive ion etching process is performed with the second etch resistant mask 216 and (optionally) the fourth patterned photoresist mask 244 being intact. As a result, second group of trenches 222 is formed. Meanwhile, due to the presence of the second etch resistant mask 216, the etchant particles from the second reactive ion etching process do not alter the geometry of the first group of trenches 214.

Figure 17:
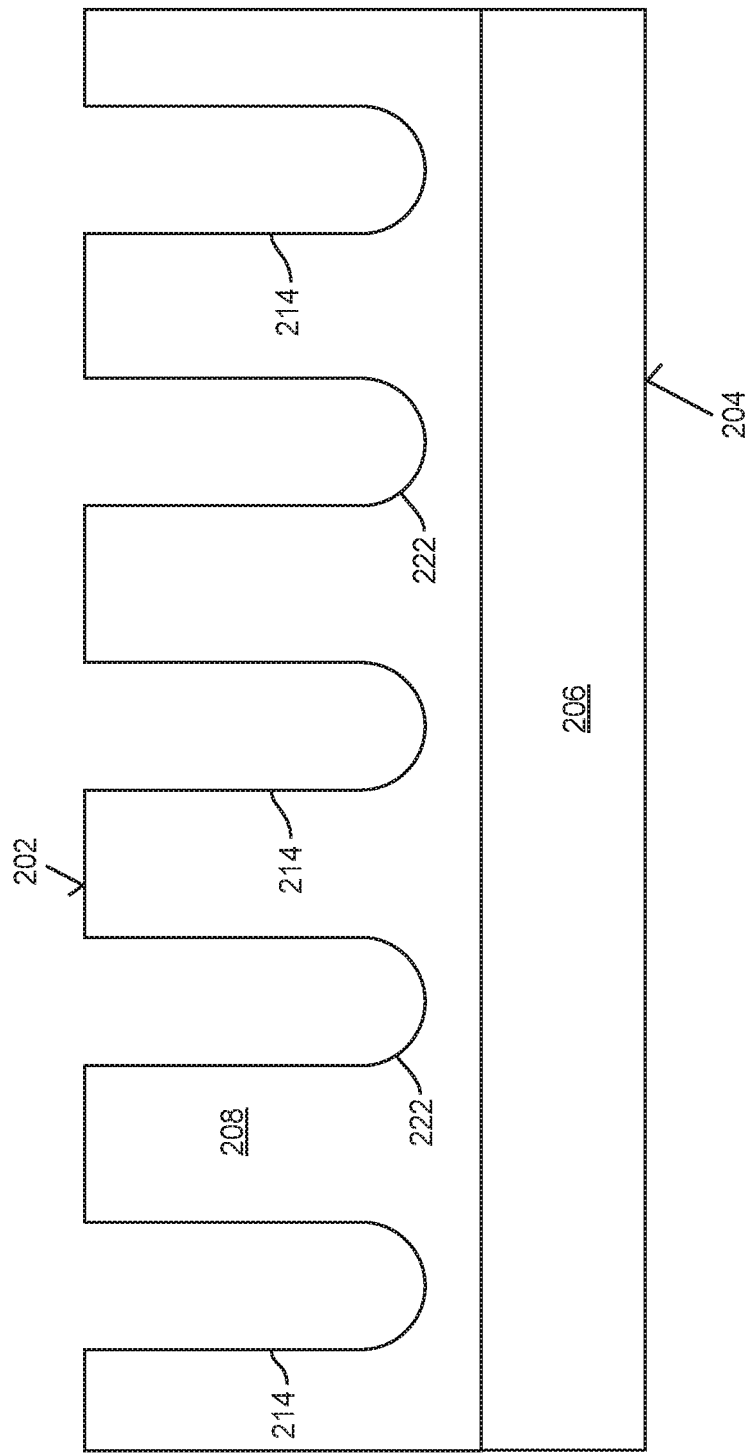
FIG. 17 illustrates removing the filler material from the trenches of the first group, according to an embodiment.

Referring to FIG. 17, after forming the second group of trenches 222, the second etch resistant mask 216 and the fourth patterned photoresist mask 244 are removed. This can be done using, e.g., a wet chemical technique or an ashing technique, for example. Subsequently, the first electrically conductive material 240 and the first dielectric layer 238 are removed from each of the trenches 214 in the first group. This can be done using a wet chemical etching technique, for example.

FIGS. 18-27 depict a reactive ion etching technique, according to another embodiment. This technique can be substantially similar or identical to the technique described with reference to FIGS. 11-17, with the exception that the filler material 220 provided in the trenches is not removed after forming the second group of trenches 222. In this case, the filler material 220 that is formed in the first group of trenches 214 before the first reactive ion etching process can be retained after trench formation and used as an integral component of an active semiconductor device, such as the field plate 124 and corresponding field plate dielectric 126 in the device described with reference to FIG. 1. One benefit of this technique is reduced processing steps and reduced thermal budget in comparison to the technique described with reference to FIGS. 11-17.

Figure 18:
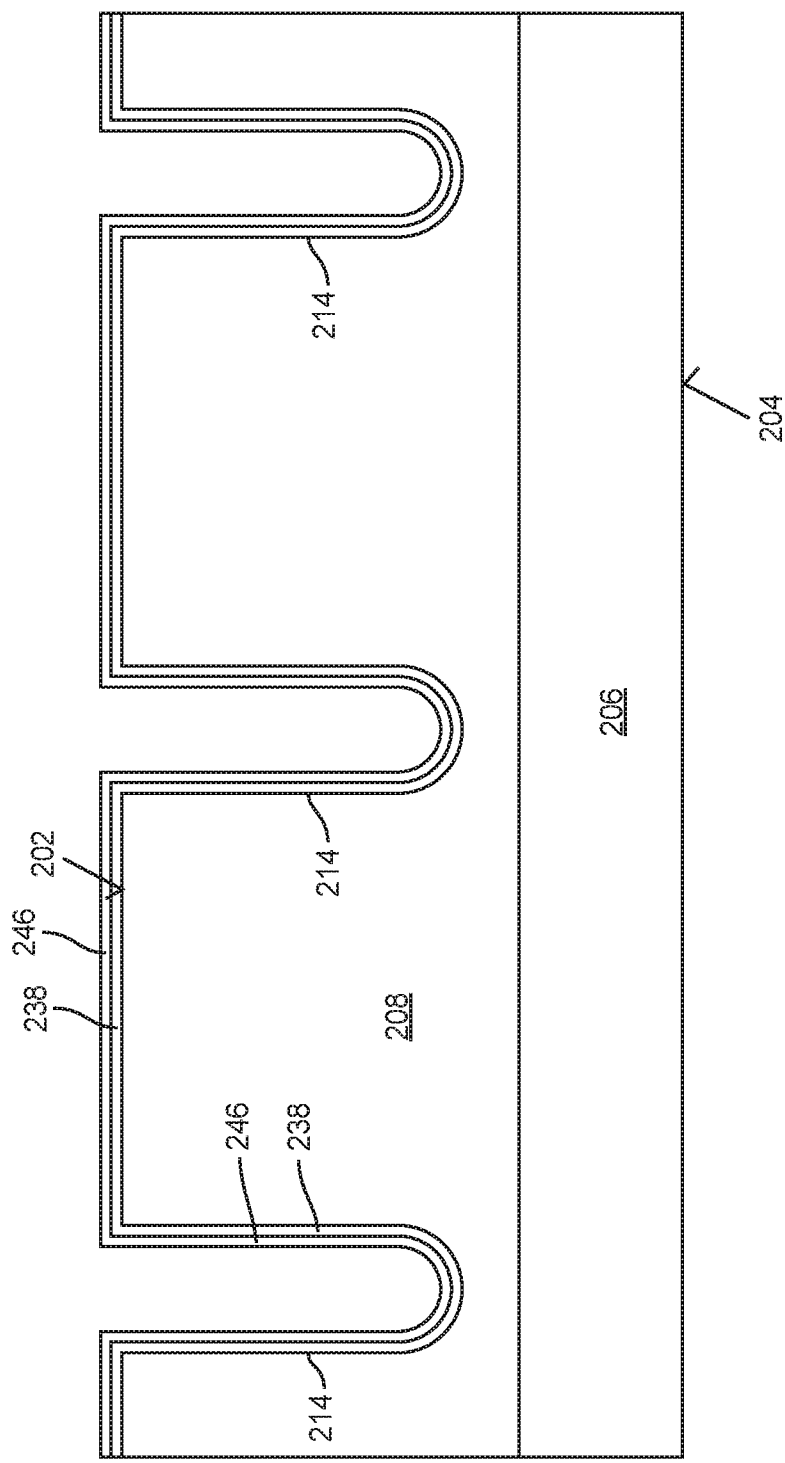
FIG. 18 illustrates forming first and second dielectric layers that line the first group of trenches, according to an embodiment.

Referring to FIG. 18, the semiconductor wafer 200 is provided with the first group of trenches 214 according to any of the techniques described herein. After forming the first group of trenches 214 and removing any etch resistant materials present, the first dielectric layer 238 is formed conformally, e.g., using a deposition technique, on the exposed semiconductor surfaces of the semiconductor wafer 200, e.g., in a similar or identical manner as previously described. Optionally, a second dielectric layer 246 is formed conformally, e.g., using a deposition technique, on the first dielectric layer 238 e.g., in a similar or identical manner as previously described. Exemplary thickness values for both layer 238, 246 of dielectric material are in the range of 30-60 nm.

Figure 19:
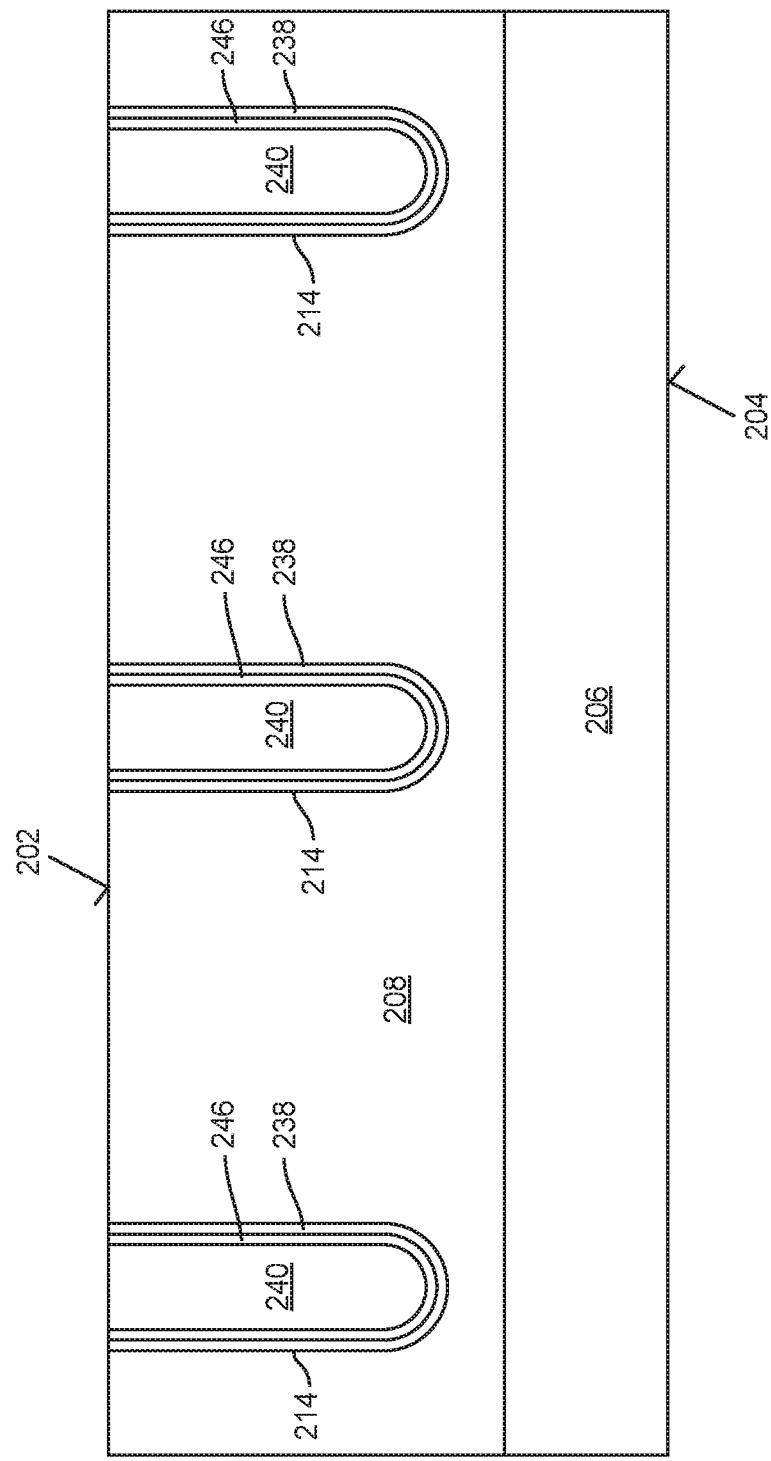
FIG. 19 illustrates filling the trenches in the first group with an electrical conductor and planarizing the wafer, according to an embodiment.

Referring to FIG. 19, each of the trenches 214 in the first group are filled with the first electrically conductive material 240 in a similar manner as previously described. Subsequently, a planarization process is performed such that a top side of the first dielectric layer 238, the second dielectric layer 246 and the first electrically conductive material 240 disposed in the first group of trenches 214 is coplanar with the main surface 202. This planarization may be done according to the technique previously described with reference to FIG. 14.

Figure 20:
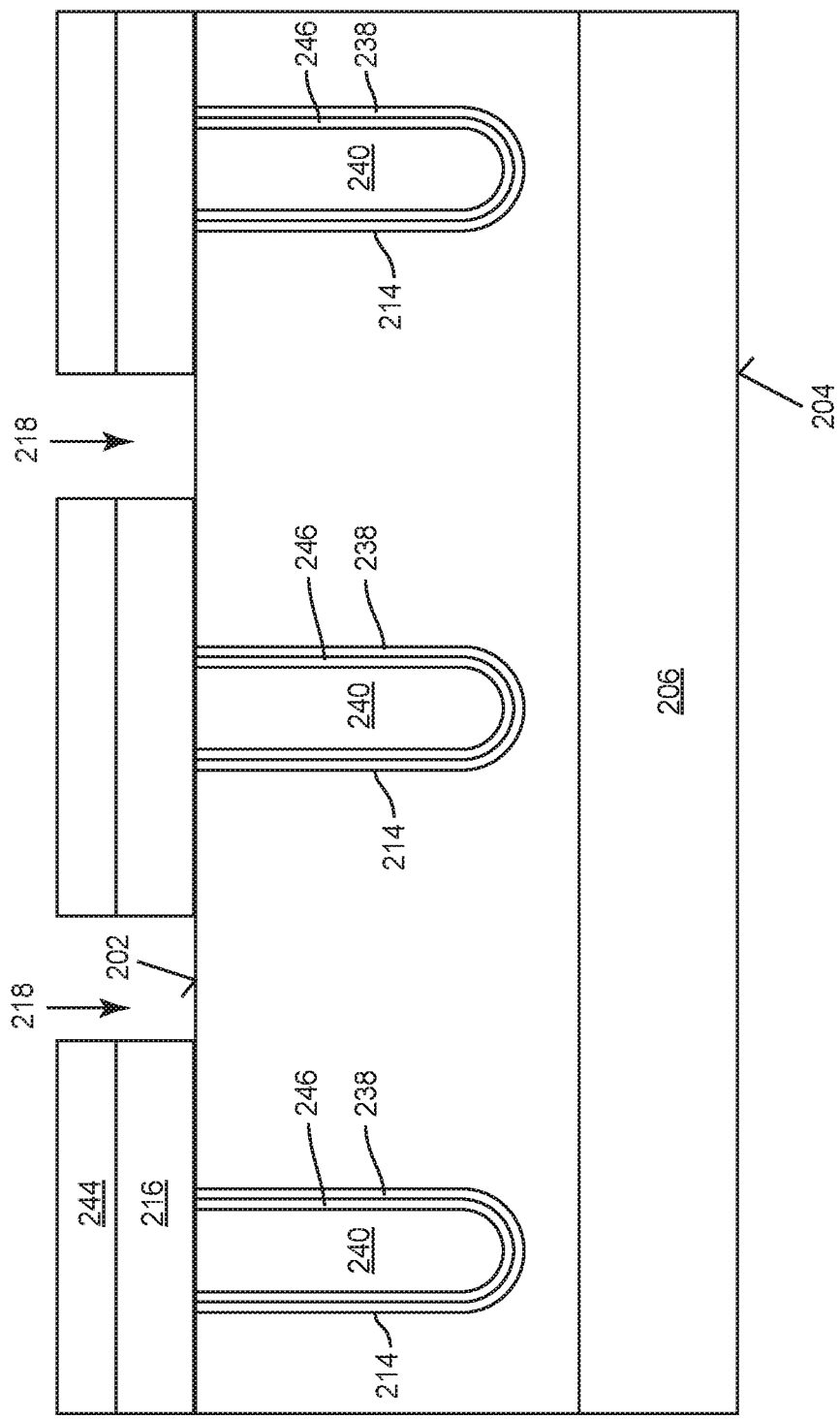
FIG. 20 illustrates forming a second hard mask layer and a second photoresist mask on the substrate and over the filled trenches, according to an embodiment.

Referring to FIG. 20, after filling the trenches 214 in the first group and planarizing, the second etch resistant mask 216 and the fourth patterned photoresist mask 244 are formed. This may be done according to the technique previously described with reference to FIG. 15. The second etch resistant mask 216 is patterned to include the second set of openings 218, e.g., in the previously described manner.

Figure 21:
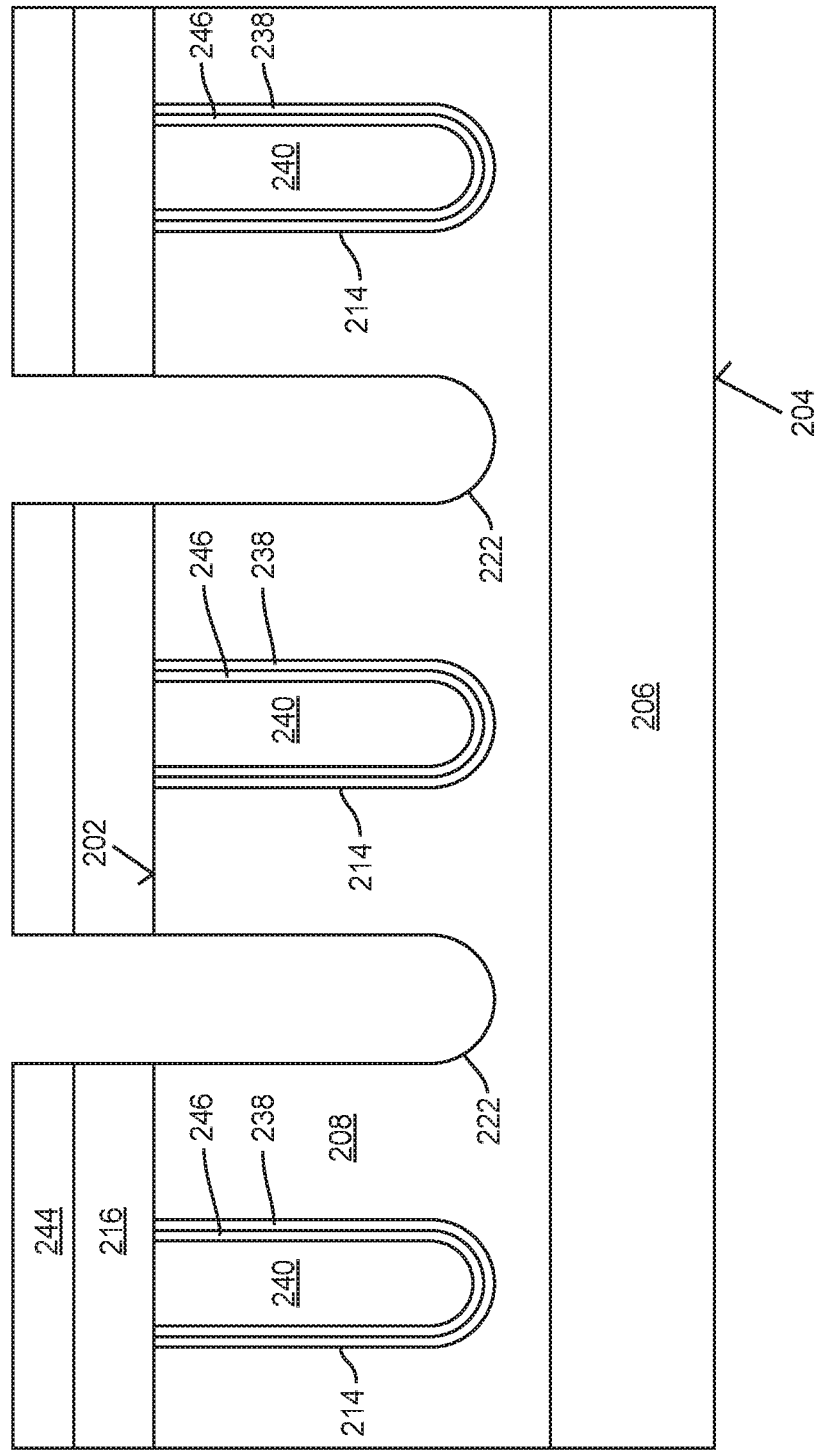
FIG. 21 illustrates forming a second group of trenches by performing a second reactive ion etching step, according to an embodiment.

Referring to FIG. 21, the second reactive ion etching process is performed with the second etch resistant mask 216 and (optionally) the fourth patterned photoresist mask 244 being intact. As a result, the second group of trenches 222 is formed. Meanwhile, due to the presence of the second etch resistant mask 216, the etchant particles from the second reactive ion etching process do not alter the geometry of the first group of trenches 214, nor to they alter the composition of the material filling the first group of trenches 214.

Figure 22:
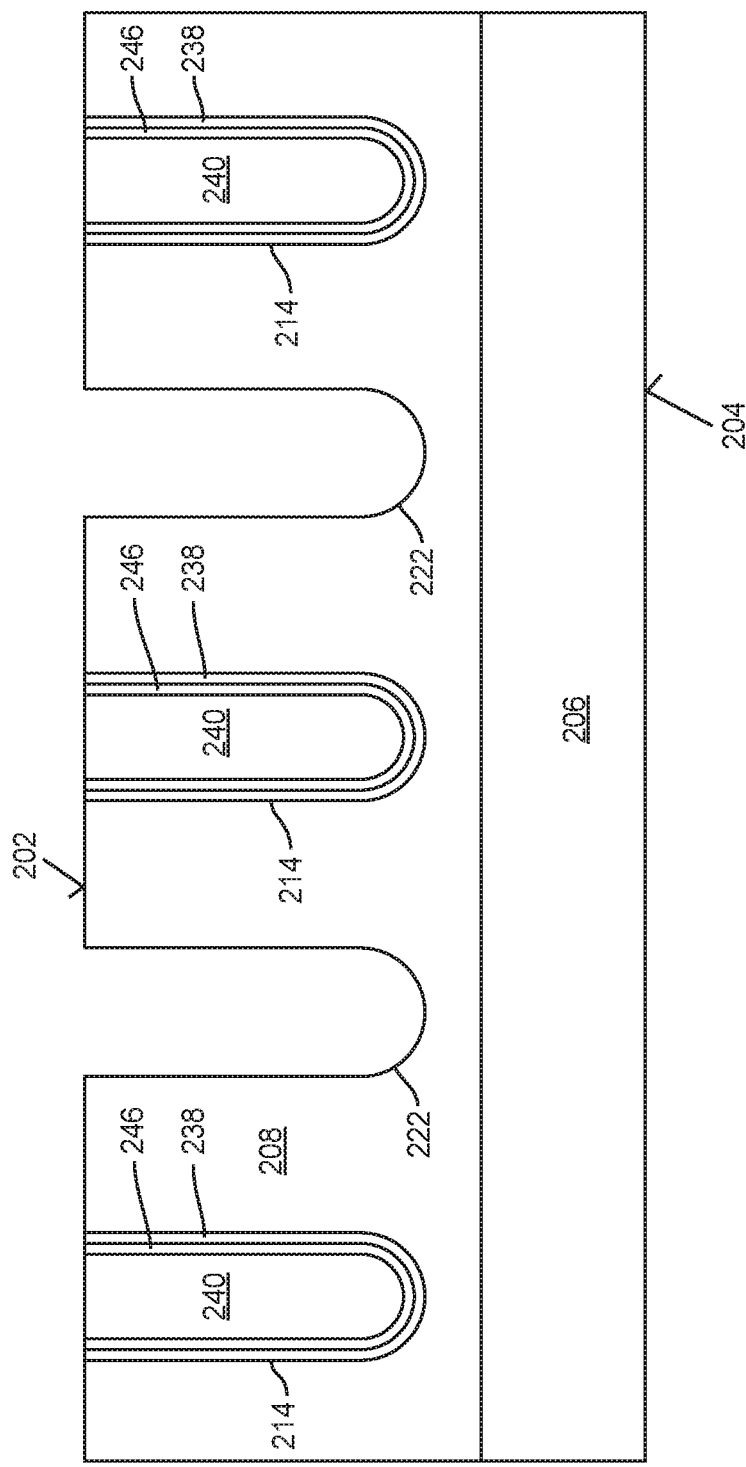
FIG. 22 illustrates removing the second hard mask layer and the second photoresist mask, according to an embodiment.

Referring to FIG. 22 after forming the second group of trenches 222, the second etch resistant mask 216 and the fourth patterned photoresist mask 244 are removed. This can be done using, e.g., a wet chemical technique or an ashing technique, for example.

Figure 23:
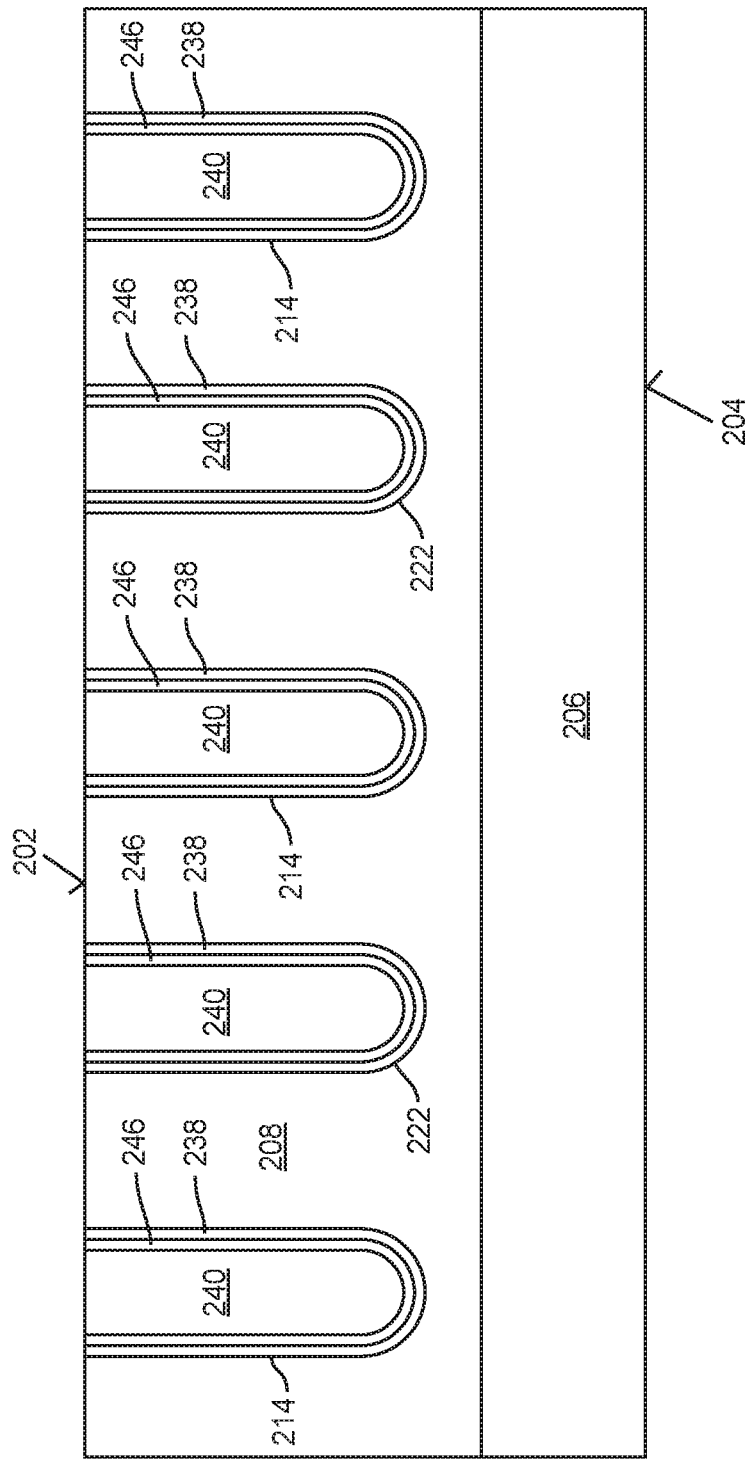
FIG. 23 illustrates filling the trenches in the second group with the same dielectric layers and conductive material that fills the trenches in the first group, according to an embodiment.

Referring to FIG. 23, each of the trenches 222 in the second group are filled with the first dielectric layer 238, the second dielectric layer 246, and the first electrically conductive material 240. This can be done using the techniques described with reference to FIGS. 19-20, i.e., by depositing conformal layers and subsequently planarizing. As a result, useful and identically configured electrode structures are formed in each of the trenches 214, 222 from the first and second groups.

Figure 24:
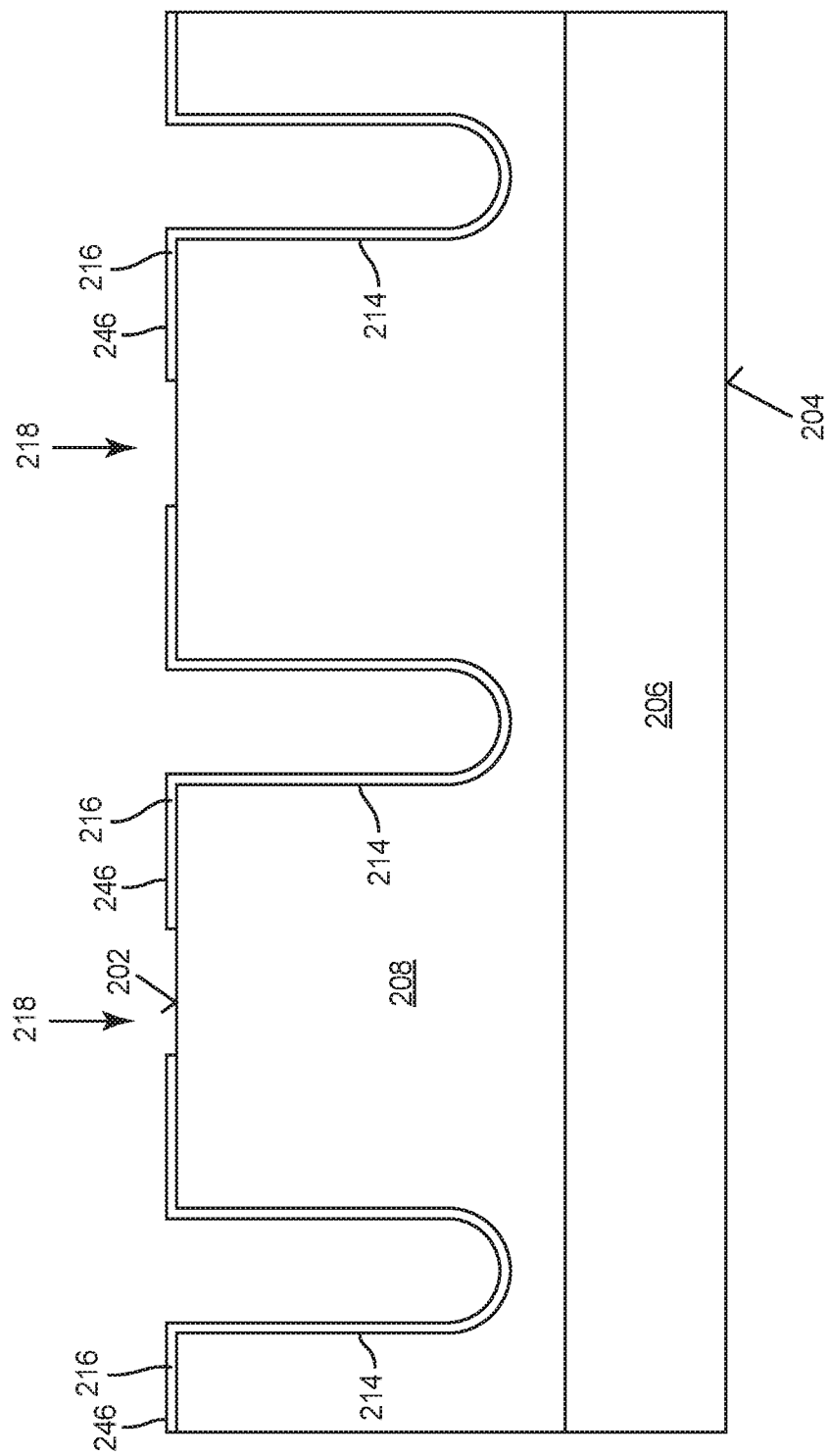
FIG. 24 illustrates forming a first layer of carbon-containing material that lines the trenches of the first group and includes a second set of openings, according to an embodiment.
Figure 25:
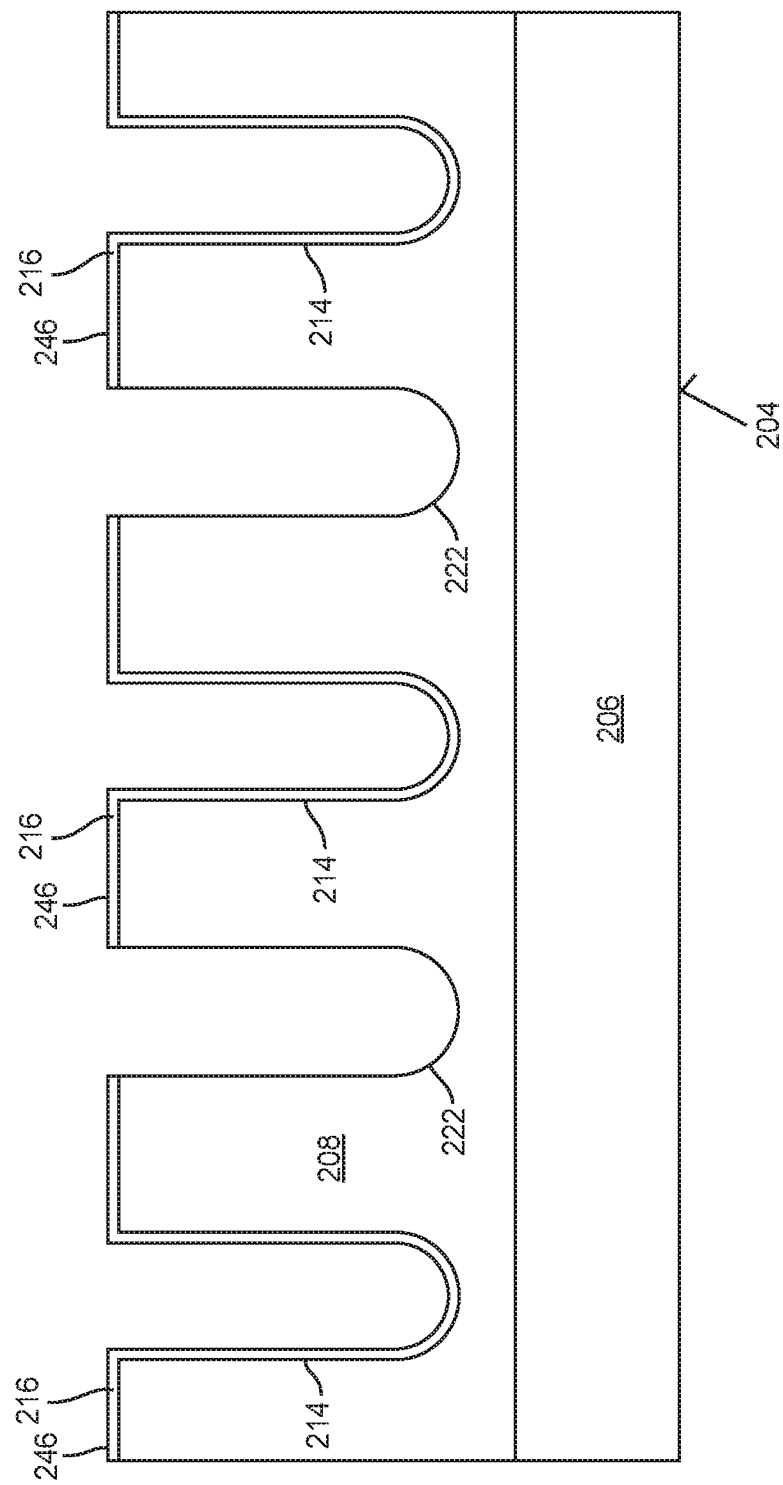
FIG. 25 illustrates forming a second group of trenches by performing a second reactive ion etching step, according to an embodiment.

FIGS. 24-25 depict a reactive ion etching technique, according to another embodiment. According to this technique, after forming the first group of trenches 214, a carbon-containing layer 246 is conformally deposited on the semiconductor wafer 200 and used as the second etch resistant mask 216. This technique advantageously offers fewer processing steps than those previously described. Moreover, the deposition of the carbon-containing mask offers a reduced thermal budget in comparison to other techniques.

Referring to FIG. 24, the semiconductor wafer 200 is provided with the first group of trenches 214 according to any of the techniques described herein. After removing any etch resistant material and photoresist material, a carbon-containing layer 246 is formed on the semiconductor wafer 200. In one embodiment, the carbon layer 246 can be a layer of diamond-like carbon. The carbon-containing layer 246 can be deposited, e.g., using a CVD or plasma deposition process so as to completely line the sidewalls and bottom of each trench 214 in the first group. An exemplary thickness value of the carbon-containing layer 246 is in the range of 300-600 nm. The carbon-containing layer 246 is patterned to include the second set of openings 218. Thus, the main surface 202 of the semiconductor wafer 200 is directly exposed by the second set of openings 218 in the carbon-containing layer 246. According to one technique, the carbon-containing layer 246 is patterned in the desired geometry by forming a patterned layer of silicon oxynitride (SiONx) (not shown) over the carbon layer and using this patterned layer as an etch mask for the etching of the carbon layer.

Referring to FIG. 25, the second reactive ion etching process is performed with the patterned carbon-containing layer 246 being intact. As a result, the second group of trenches 222 are formed. Meanwhile, due to the presence of the carbon-containing layer 246, the etchant particles from the second reactive ion etching process do not alter the geometry of the first group of trenches 214. After forming the trenches 222 of the second group, the carbon-containing layer 246 is removed. This can be done using a plasma $O_2$ etch technique, for example.

FIGS. 26-39 depict a reactive ion etching technique, according to another embodiment. According to this technique, both of the first and second etch resistant masks 210, 216 are formed from photoresist material using photolithography techniques. This offers a reduced thermal budget in comparison to hardmask techniques.

Figure 26:
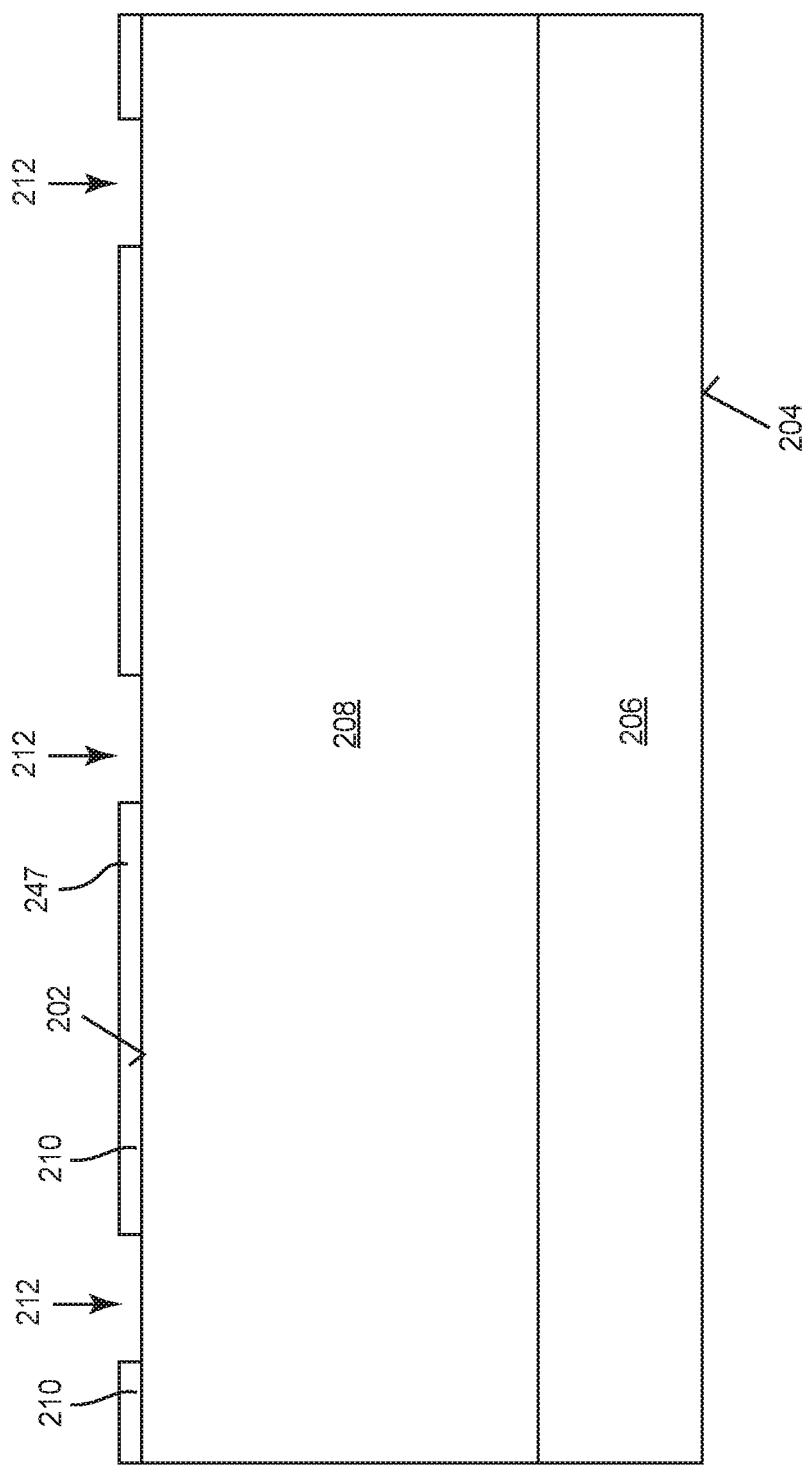
FIG. 26 illustrates providing a first photoresist mask with a first set of openings on a semiconductor wafer, according to an embodiment.

Referring to FIG. 26, the first etch resistant mask 210 is provided on the main surface 202. In this example, the first etch resistant mask 210 is provided from a fifth patterned photoresist mask 247. Accordingly, the first etch resistant mask 210 can be formed by a first photolithography process (negative or positive) and can include any of a variety of photoresist materials. The fifth patterned photoresist mask 247 is patterned to include the first group of openings 212.

Figure 27:
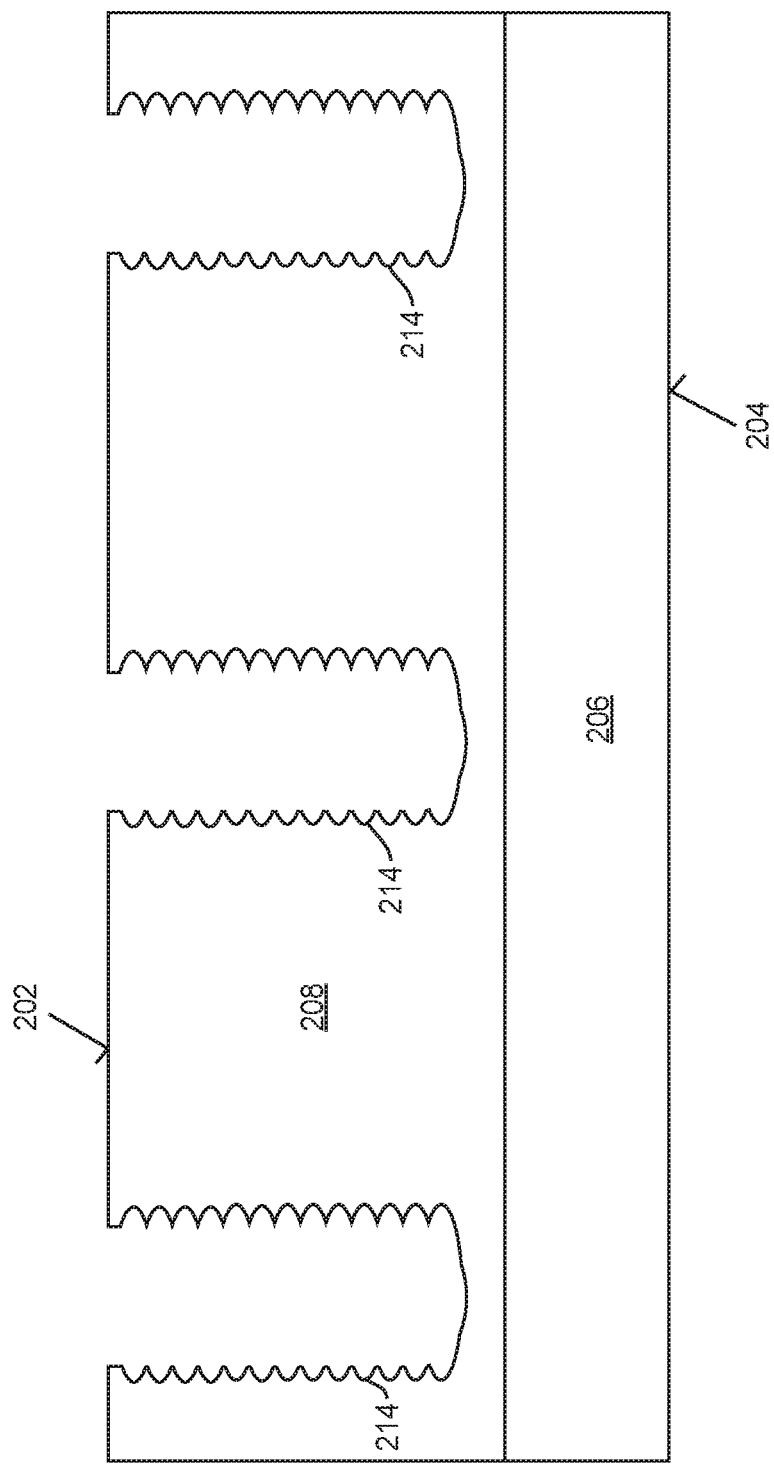
FIG. 27 illustrates forming a first group of trenches by performing a first reactive ion etching step, according to an embodiment.

Referring to FIG. 27, the first reactive ion etching process is performed. As a result, the first group of trenches 214 is formed. In this example, the first reactive ion etching process is a Bosch etching process, thus forming scalloped-shaped sidewalls in the trenches 214 as shown. A Bosch etching process may be preferred in this case because it is compatible with the photoresist material of the fifth patterned photoresist mask 247. That is, the Bosch technique allows for the formation of deep trenches without stripping the photoresist. After forming the first group of trenches 214, the first etch resistant mask 210 is removed. This can be done by a wet chemical etch or an ashing technique, for example.

Figure 28:
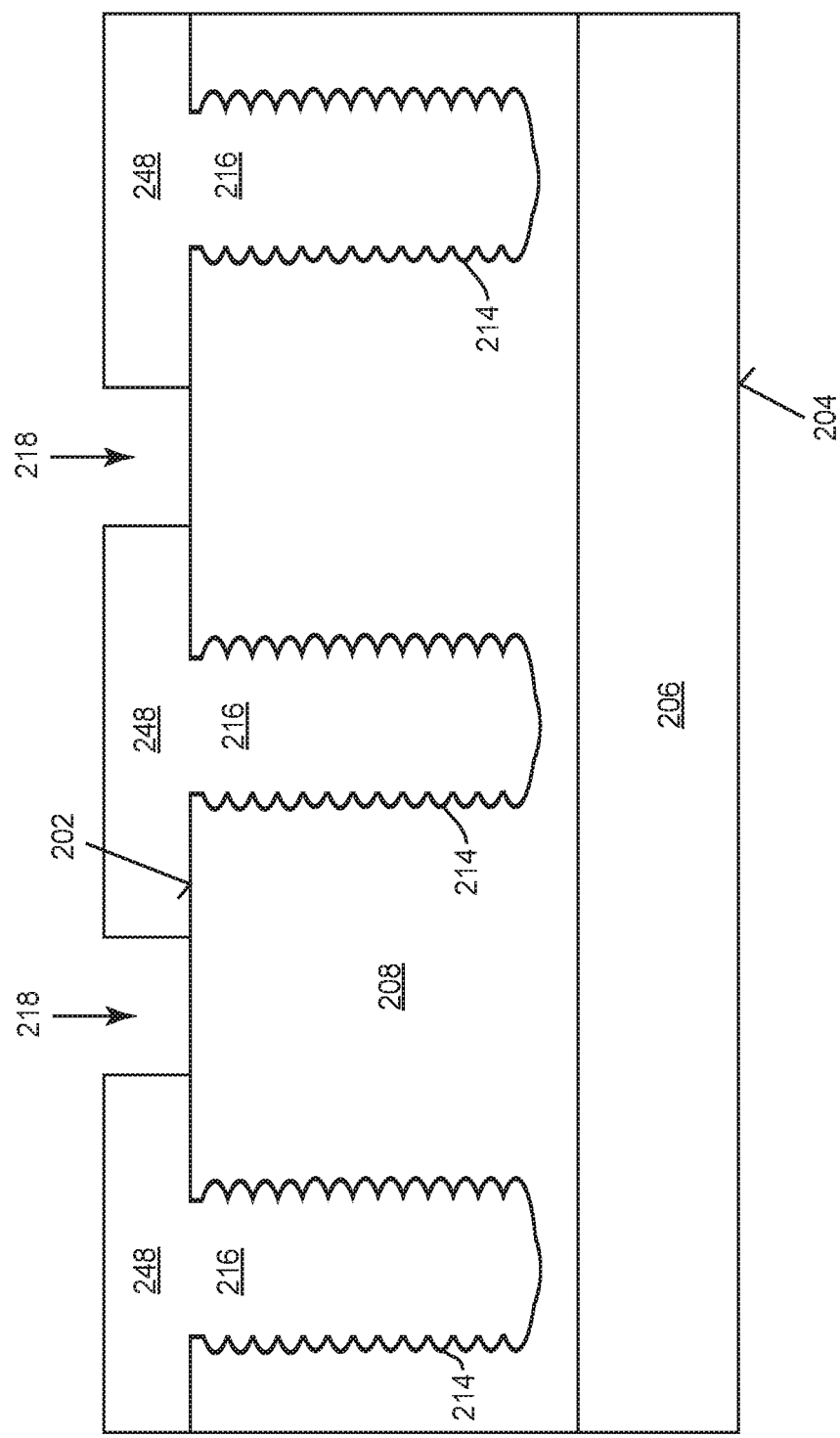
FIG. 28 illustrates filling the first group of trenches with a second patterned photoresist mask, according to an embodiment.

Referring to FIG. 28, after removing the first etch resistant mask 210, the second etch resistant mask 216 is formed on the on the semiconductor wafer 200. In this example, the second etch resistant mask 216 is provided by a fifth patterned photoresist mask 248 using a second photolithography process. In this case, the fifth patterned photoresist mask 248 is formed in such a way that it completely fills each of the trenches 214 in the first group. The second photolithography process can be either a negative or positive technique. Depending on the shape and configuration of the first group of trenches 214, a negative photolithography technique may be preferable, as these techniques are typically well suited for the filling of deep trenches. The fifth patterned photoresist mask 248 is patterned to include second set of openings 218.

Figure 29:
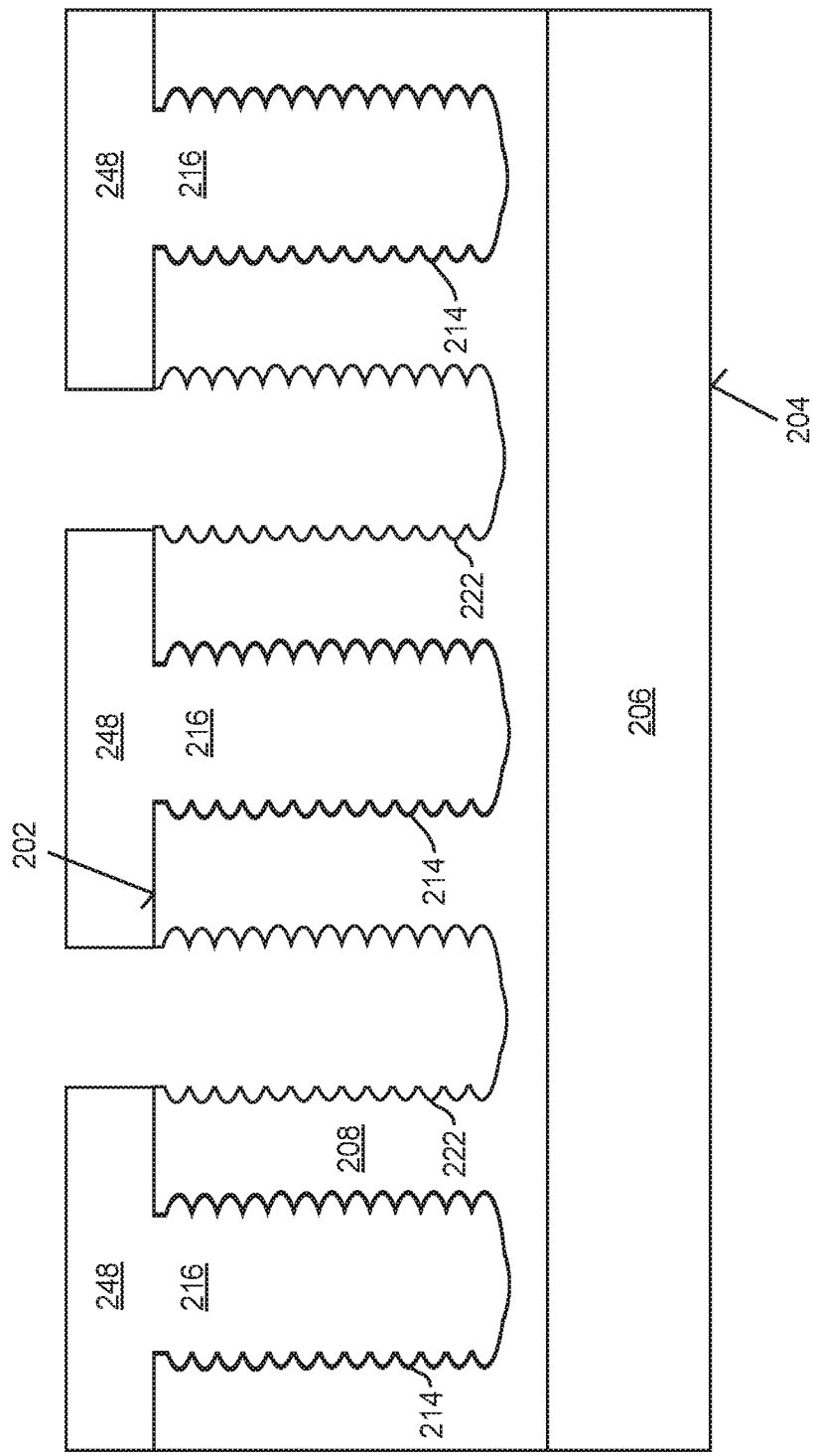
FIG. 29 illustrates forming a second group of trenches by performing a second reactive ion etching step, according to an embodiment.

Referring to FIG. 29, the second reactive ion etching process is performed with the second etch resistant mask 216, i.e., the fifth patterned photoresist mask 248, being intact. As a result, the trenches 222 of the second group are formed. Meanwhile, due to the presence of the second etch resistant mask 216, the etchant particles from the second reactive ion etching process do not alter the geometry of the first group of trenches 214. In this example, the second reactive ion etching process is a Bosch etching process, thus forming scalloped-shaped sidewalls in the trenches of the second group as shown. After forming the second group of trenches 222, the fifth patterned photoresist mask 248 is removed. This can be done by a wet chemical etch or an ashing technique, for example. Further processing steps may be performed to smooth out the sidewalls and round the bottoms of the trenches in the first and second groups. Generally speaking, these further processing steps can include high temperature processing and/or oxidation steps.

The vertical power semiconductor device 100 discussed herein, which is configured as a trenched gate vertical MOSFET, represents just one example of a wide variety of device types to which the presently disclosed techniques are applicable. For example, other types of vertical power semiconductor devices, such as diodes, insulated gate bipolar transistors (IGBTs), thyristors, etc., may similarly include field plate structures that provide a similar functionality as the field plate structure described with reference to FIG. 1. The multi-step reactive ion etching technique described herein is equally applicable to the formation of the field plate trenches for any of these device types. More generally, the trenches formed according to the presently disclosed techniques can be utilized in combination with or as integral components of a wide variety of semiconductor device types, e.g., lateral transistors, high frequency devices, etc., and can be employed in a wide variety of integrated circuit types, e.g., analog devices, controllers, processors, etc.

As used herein, the term "substantially" encompasses absolute conformity with a requirement as well as minor deviation from absolute conformity with the requirement due to manufacturing process variations. Provided that the deviation is within process tolerances and the components described herein can function according to the application requirements, the term "substantially" encompasses any of the values within these deviations.

As used herein, the term "about" encompasses absolute conformity with a requirement as well as minor deviations from absolute conformity with the requirement due to equipment-specific calibrations.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some figures illustrate relative doping concentrations by indicating "−" or "+" next to the conductivity type. For example, "$n^-$" means a doping concentration which is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

According to an embodiment of a method of forming a semiconductor device that can be combined with others, a semiconductor wafer having a main surface is provided. A first etch resistant mask is provided on the semiconductor wafer that partially covers the main surface and includes a first set of openings that expose the main surface. A first reactive ion etching step that forms a first group of trenches by removing semiconductor material through the first set of openings is performed. Each of the trenches in the first group is covered with a second etch resistant mask after performing the first reactive ion etching step. A second set of openings is provided in one or both of: the first etch resistant mask, and the second etch resistant mask. The second set of openings expose the main surface. A second reactive ion etching step that forms a second group of trenches by removing semiconductor material through the second set of openings is performed. The trenches in the second group are laterally offset from the trenches in the first group. The first and second first reactive ion etching processes are performed such that a depth of the trenches of the first group is substantially equal to a depth of the trenches in the second group.

According to an embodiment that can be combined with others, the method further includes filling each of the trenches in the first and second groups with an electrical conductor or insulator such that each of the trenches in the first and second groups comprise identically configured structures.

According to an embodiment that can be combined with others, the method further includes forming a plurality of active semiconductor devices in the semiconductor wafer. Filling each of the trenches comprises forming field electrodes in each one of the trenches in the first and second groups. Each of the field electrodes are integral components of at least one of the active semiconductor devices.

According to an embodiment that can be combined with others, the method further includes forming a first hard mask layer on the main surface, forming a first patterned photoresist mask on the first hard mask layer, the first patterned photoresist mask being patterned to include locations of the first openings using a first photolithography process, and forming the first set of openings in the first hard mask layer using the first patterned photoresist mask.

According to an embodiment that can be combined with others, the first patterned photoresist mask is patterned to include locations of the second openings using the first photolithography process, and wherein the second openings are formed simultaneously while forming the first openings using the first patterned photoresist mask.

According to an embodiment that can be combined with others, the method further includes forming a second patterned photoresist mask on the first hard mask layer using a second photolithography process prior to performing the first reactive ion etching step, the second patterned photoresist mask completely fills the second openings in the first hard mask layer, the second patterned photoresist mask completely fills the second openings in the first hard mask layer.

According to an embodiment that can be combined with others, covering each of the trenches in the first group with the second etch resistant mask comprises forming a third patterned photoresist mask on the wafer using a third photolithography process, wherein the third patterned photoresist mask completely fills each of the trenches in the first group, and wherein the third patterned photoresist mask is patterned to completely expose the second openings in the first hard mask layer.

According to an embodiment that can be combined with others, the first hard mask layer is removed before performing the second reactive ion etching step, and covering each of the trenches in the first group with a second etch resistant mask comprises forming a second hard mask layer on the main surface.

According to an embodiment that can be combined with others, providing the second set of openings comprises forming a second patterned photoresist mask on the second hard mask layer using a second photolithography process, the second patterned photoresist mask being patterned to include locations of the second openings, and forming the second set of openings in the second hard mask layer using the second patterned photoresist mask.

According to an embodiment that can be combined with others, before forming the second hard mask layer, the method includes lining the sidewalls of each of the trenches in the first group with a first dielectric material, filling each of the trenches in the first group with a first electrically conductive material, and planarizing the semiconductor wafer such that top sides of the first dielectric material and the first conductive material disposed in the trenches of the first group are coplanar with the main surface. The second hard mask layer is formed on a top side of the planarized first dielectric material and first conductive material disposed in the trenches of the first group.

According to an embodiment that can be combined with others, the method further includes, after forming the second group of trenches, removing the first electrically conductive material and the first dielectric material from each of the trenches in the first group.

According to an embodiment that can be combined with others, the method further includes, after forming the second group of trenches, lining the sidewalls of each of the trenches in the second group with the first dielectric material, and filling each of the trenches in the second group with the first electrically conductive material.

According to an embodiment that can be combined with others, covering each of the trenches in the first group includes forming a first layer of carbon on the semiconductor wafer after forming the first group of trenches such that each of the trenches in the first group are completely lined by the first layer of the carbon, and the first layer of carbon is patterned to include the second openings.

According to an embodiment that can be combined with others, providing the first etch resistant mask includes forming a first patterned photoresist mask on the main surface, the first patterned photoresist mask being patterned to include locations of the first openings using a first photolithography process, and the first reactive ion etching step is a Bosch etching process.

According to an embodiment that can be combined with others, covering each of the trenches in the first group includes forming a second patterned photoresist mask on the semiconductor wafer using a second photolithography process. The second patterned photoresist mask completely fills each of the trenches in the first group, and the second patterned photoresist mask is patterned to include the second openings.

According to another embodiment of the method that can be combined with others, a semiconductor wafer having a main surface is provided. A first reactive ion etching process that forms a first group of trenches extending from the main surface into the semiconductor wafer is performed. A second reactive ion etching process is performed after performing the first reactive ion etching process. The second reactive ion etching process forms a second group of trenches. Each of the trenches in the second group extend from the main surface into the semiconductor wafer and are laterally offset from the trenches in the first group. The main surface of the semiconductor wafer is covered with etch resistant material during both of the first and second reactive ion etching processes such that no more than half of an overall surface area of the main surface is exposed to etchant particles during each of the first and second reactive ion etching processes. The first and second first reactive ion etching processes are performed such that a depth of the trenches of the first group is substantially equal to a depth of the trenches in the second group.

According to an embodiment that can be combined with others, the method further includes performing a third reactive ion etching process after performing the second reactive ion etching process, the third reactive ion etching process forming a third group of trenches, each of the trenches in the third group extending from the main surface and being laterally offset from the trenches in the first and second groups. The main surface of the semiconductor wafer is covered with the etch resistant material during the third reactive ion etching process such that no more than half of the overall surface area of the main surface is exposed to etchant particles during the third reactive ion etching process.

According to an embodiment that can be combined with others, the trenches of the first group are formed alternatingly with the trenches in the second group.

According to an embodiment that can be combined with others, each of the trenches in the first group are formed together in a first section of the semiconductor wafer, and each of the trenches in the second group are formed together in a second section of the semiconductor wafer, wherein the first and second sections are non-overlapping and adjacent to one another.

According to an embodiment that can be combined with others, the method further includes forming a plurality of semiconductor dies in the semiconductor wafer. A first one of the semiconductor dies in the plurality comprises trenches from the first group and not the second group. A second one of the semiconductor dies in the plurality comprises trenches from the second group and not the first group.

According to another embodiment of the method that can be combined with others, a semiconductor wafer having a main surface and an interface beneath the main surface is provided. A maximum target trench depth for trenches formed in the semiconductor wafer is determined. The maximum target trench depth is less than a distance between the main surface and the interface. A first reactive ion etching process that forms a first group of trenches extending from the main surface into the semiconductor wafer is performed. A second reactive ion etching process that forms a second group of trenches extending from the main surface into the semiconductor wafer is performed. The trenches in the second group are laterally offset from the trenches in the first group. A percentage surface area of the main surface of the semiconductor wafer is covered with etch resistant material during both of the first and second reactive ion etching processes. Process parameters of the first and second reactive ion etching processes are controlled such that a depth of the trenches in the first and second groups is substantially equal to the maximum target trench depth. Determining the maximum target trench depth includes correlating a variation in the depth of the trenches in the first and second groups to the percentage surface area of the main surface that is covered with etch resistant material during each of the first and second reactive ion etching processes.

According to an embodiment that can be combined with others, correlating the variation in the depth of the trenches formed comprises selecting a fixed value for the percentage surface area of the main surface that is covered to derive the variation in the depth of the trenches, and determining the maximum target trench depth further comprises using the derived variation to select the maximum target trench depth such that the deepest trench formed by the first and second reactive ion etching processes is separated from the interface by a minimum separation distance.

According to an embodiment that can be combined with others, correlating the variation in the depth of the trenches formed comprises selecting a fixed value for the trench depth variation to derive a necessary percentage surface area of the main surface that is covered during each of the first and second reactive ion etching processes to obtain the fixed value for the trench depth variation, and the main surface of the semiconductor wafer is covered by at least the necessary percentage surface area during each of the first and second reactive ion etching processes.

According to an embodiment that can be combined with others, the fixed value for the trench depth variation is selected to be substantially no greater than seven percent.

According to an embodiment that can be combined with others, the semiconductor wafer comprises a base substrate and a first epitaxial layer extending to the main surface, and the interface is a meeting point between the base substrate and the first epitaxial layer.

According to an embodiment that can be combined with others, the semiconductor wafer includes an exposed rear surface that is opposite the main surface, and wherein the interface is the rear surface.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A method of forming a semiconductor device, the method comprising:
   providing a semiconductor wafer comprising a main surface;
   providing a first etch resistant mask on the semiconductor wafer that partially covers the main surface and includes a first set of openings;
   performing a first reactive ion etching step that forms a first group of trenches by removing semiconductor material through the first set of openings;
   covering each of the trenches in the first group with a second etch resistant mask after performing the first reactive ion etching step;
   providing a second set of openings in one or both of: the first etch resistant mask, and the second etch resistant mask, the second set of openings;
   performing a second reactive ion etching step that forms a second group of trenches by removing semiconductor material through the second set of openings, the trenches in the second group being laterally offset from the trenches in the first group,
   wherein the first and second reactive ion etching processes are performed such that a depth of the trenches of the first group is substantially equal to a depth of the trenches in the second group,
   wherein the first reactive ion etching processes is initiated with portions of the main surface being exposed by the first set of openings, and
   wherein the second reactive ion etching processes is initiated with portions of the main surface being exposed by the second set of openings.

2. The method of claim 1, further comprising:
   filling each of the trenches in the first and second groups with an electrical conductor or insulator such that each of the trenches in the first and second groups comprise identically configured structures.

3. The method of claim 2, further comprising:
   forming a plurality of active semiconductor devices in the semiconductor wafer,
      wherein filling each of the trenches comprises forming field electrodes in each one of the trenches in the first and second groups,
      wherein each of the field electrodes are integral components of at least one of the active semiconductor devices.

4. The method of claim 1, wherein providing the first etch resistant mask comprises:
   forming a first hard mask layer on the main surface;
   forming a first patterned photoresist mask on the first hard mask layer, the first patterned photoresist mask being patterned to include locations of the first openings using a first photolithography process; and
   forming the first set of openings in the first hard mask layer using the first patterned photoresist mask.

5. The method of claim 4, wherein the first patterned photoresist mask is patterned to include locations of the second openings using the first photolithography process, and wherein the second openings are formed simultaneously while forming the first openings using the first patterned photoresist mask.

6. The method of claim 5, further comprising:
   forming a second patterned photoresist mask on the first hard mask layer using a second photolithography process prior to performing the first reactive ion etching step,
      wherein the second patterned photoresist mask completely fills the second openings in the first hard mask layer,
      wherein the second patterned photoresist mask is patterned to completely expose the first openings in the first hard mask layer.

7. The method of claim 6, wherein covering each of the trenches in the first group with the second etch resistant mask comprises forming a third patterned photoresist mask on the wafer using a third photolithography process, wherein the third patterned photoresist mask completely fills each of the trenches in the first group, and wherein the third patterned photoresist mask is patterned to completely expose the second openings in the first hard mask layer.

8. The method of claim 4, wherein the first hard mask layer is removed before performing the second reactive ion etching step, and wherein covering each of the trenches in the first group with a second etch resistant mask comprises forming a second hard mask layer on the main surface.

9. The method of claim 8, wherein providing the second set of openings comprises:
   forming a second patterned photoresist mask on the second hard mask layer using a second photolithography process, the second patterned photoresist mask being patterned to include locations of the second openings; and
   forming the second set of openings in the second hard mask layer using the second patterned photoresist mask.

10. The method of claim 8, further comprising, before forming the second hard mask layer:
   lining the sidewalls of each of the trenches in the first group with a first dielectric material;
   filling each of the trenches in the first group with a first electrically conductive material; and
   planarizing the semiconductor wafer such that top sides of the first dielectric material and the first conductive material disposed in the trenches of the first group are coplanar with the main surface, and
      wherein the second hard mask layer is formed on a top side of the planarized first dielectric material and first conductive material disposed in the trenches of the first group.

11. The method of claim 10, further comprising, after forming the second group of trenches:
   removing the first electrically conductive material and the first dielectric material from each of the trenches in the first group.

12. The method of claim 10, further comprising, after forming the second group of trenches:

lining the sidewalls of each of the trenches in the second group with the first dielectric material; and filling each of the trenches in the second group with the first electrically conductive material.

13. The method of claim 1, wherein covering each of the trenches in the first group comprises:

forming a first carbon-containing layer on the semiconductor wafer after forming the first group of trenches such that each of the trenches in the first group are completely lined by the first layer of the carbon, and wherein the first carbon-containing layer is patterned to include the second openings.

14. The method of claim 1, wherein providing the first etch resistant mask comprises:

forming a first patterned photoresist mask on the main surface, the first patterned photoresist mask being patterned to include locations of the first openings using a first photolithography process, and wherein the first reactive ion etching step is a Bosch etching process.

15. The method of claim 14, wherein covering each of the trenches in the first group comprises:

forming a second patterned photoresist mask on the semiconductor wafer using a second photolithography process, wherein the second patterned photoresist mask completely fills each of the trenches in the first group, and wherein the second patterned photoresist mask is patterned to include the second openings.

16. The method of claim 1, wherein the first etch resistant mask is formed directly on the main surface of the semiconductor wafer.

17. A method of forming a semiconductor device, comprising:

providing a semiconductor wafer comprising a main surface;

performing a first reactive ion etching process that forms a first group of trenches extending from the main surface into the semiconductor wafer, performing a second reactive ion etching process after performing the first reactive ion etching process, the second reactive ion etching process forming a second group of trenches, each of the trenches in the second group extending from the main surface into the semiconductor wafer and being laterally offset from the trenches in the first group;

covering the main surface of the semiconductor wafer with etch resistant material during both of the first and second reactive ion etching processes such that no more than half of an overall surface area of the main surface is exposed to etchant particles during each of the first and second reactive ion etching processes, and wherein the first and second reactive ion etching processes are performed such that a depth of the trenches of the first group is substantially equal to a depth of the trenches in the second group, wherein the first reactive ion etching processes is initiated with portions of the main surface being exposed by a first set of openings in a first etch resistant mask, and wherein the second reactive ion etching processes is initiated with portions of the main surface being exposed by a second set of openings in a second etch resistant mask.

18. The method of claim 17, further comprising:

performing a third reactive ion etching process after performing the second reactive ion etching process, the third reactive ion etching process forming a third group of trenches, each of the trenches in the third group extending from the main surface and being laterally offset from the trenches in the first and second groups, wherein the main surface of the semiconductor wafer is covered with the etch resistant material during the third reactive ion etching process such that no more than half of the overall surface area of the main surface is exposed to etchant particles during the third reactive ion etching process.

19. The method of claim 17, wherein the trenches of the first group are formed alternatingly with the trenches in the second group.

20. The method of claim 17, wherein each of the trenches in the first group are formed together in a first section of the semiconductor wafer, wherein each of the trenches in the second group are formed together in a second section of the semiconductor wafer, wherein the first and second sections are non-overlapping and adjacent to one another.

21. The method of claim 17, further comprising forming a plurality of semiconductor dies in the semiconductor wafer, wherein a first one of the semiconductor dies in the plurality comprises trenches from the first group and not the second group, and wherein a second one of the semiconductor dies in the plurality comprises trenches from the second group and not the first group.

22. The method of claim 17, wherein the first etch resistant mask is formed directly on the main surface of the semiconductor wafer.

23. A method of forming a semiconductor device, comprising:

providing a semiconductor wafer comprising a main surface and an interface beneath the main surface;

determining a maximum target trench depth for trenches formed in the semiconductor wafer, the maximum target trench depth being less than a distance between the main surface and the interface;

performing a first reactive ion etching process that forms a first group of trenches extending from the main surface into the semiconductor wafer;

performing a second reactive ion etching process that forms a second group of trenches extending from the main surface into the semiconductor wafer, the trenches in the second group being laterally offset from the trenches in the first group;

covering a percentage surface area of the main surface of the semiconductor wafer with etch resistant material during both of the first and second reactive ion etching processes; and controlling process parameters of the first and second reactive ion etching processes such that a depth of the trenches in the first and second groups is substantially equal to the maximum target trench depth, wherein determining the maximum target trench depth comprises correlating a variation in the depth of the trenches formed by the first and second reactive ion etching processes to the percentage surface area of the main surface that is covered with etch resistant material during each of the first and second reactive ion etching processes.

24. The method of claim 23, wherein correlating the variation in the depth of the trenches formed comprises selecting a fixed value for the percentage surface area of the main surface that is covered to derive the variation in the depth of the trenches, and wherein determining the maximum target trench depth further comprises using the derived variation to select the maximum target trench depth such that the deepest trench formed by the first and second reactive ion etching processes is separated from the interface by a minimum separation distance.

25. The method of claim 23, wherein correlating the variation in the depth of the trenches formed comprises selecting a fixed value for the trench depth variation to derive a necessary percentage surface area of the main surface that is covered during each of the first and second reactive ion etching processes to obtain the fixed value for the trench depth variation, and wherein the main surface of the semiconductor wafer is covered by at least the necessary percentage surface area during each of the first and second reactive ion etching processes.

26. The method of claim 25, wherein the fixed value for the trench depth variation is selected to be substantially no greater than seven percent.

27. The method of claim 23, wherein the semiconductor wafer comprises a base substrate and a first epitaxial layer extending to the main surface, and wherein the interface is a meeting point between the base substrate and the first epitaxial layer.

28. The method of claim 23, wherein the semiconductor wafer comprises an exposed rear surface that is opposite the main surface, and wherein the interface is the rear surface.

* * * * *